United States Patent
Tochibayashi et al.

(10) Patent No.: US 8,815,640 B2
(45) Date of Patent: Aug. 26, 2014

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Katsuaki Tochibayashi, Tochigi (JP); Satoshi Higano, Kawachi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/652,668

(22) Filed: Oct. 16, 2012

(65) Prior Publication Data
US 2013/0099231 A1 Apr. 25, 2013

(30) Foreign Application Priority Data

Oct. 24, 2011 (JP) ................................. 2011-233171
Oct. 24, 2011 (JP) ................................. 2011-233274

(51) Int. Cl.
*H01L 29/26* (2006.01)
*H01L 21/46* (2006.01)

(52) U.S. Cl.
USPC .................................. 438/104; 257/E29.296

(58) Field of Classification Search
USPC .............................. 257/43, E29.296; 438/104
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility Zno Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Matthew W Such
*Assistant Examiner* — Scott Stowe
(74) *Attorney, Agent, or Firm* — Eric J. Robinson; Robinson Intellectual Property Law Office, P.C.

(57) ABSTRACT

A highly reliable semiconductor device and a method for manufacturing the semiconductor device are provided. In a semiconductor device including a bottom-gate transistor in which an insulating layer functioning as a channel protective film is provided over an oxide semiconductor film, elements contained in an etching gas can be prevented from remaining as impurities on a surface of the oxide semiconductor film by performing impurity-removing process after formation of an insulating layer provided over and in contact with the oxide semiconductor film and/or formation of source and drain electrode layers. The impurity concentration in the surface of the oxide semiconductor film is lower than or equal to $5 \times 10^{18}$ atoms/cm$^3$, preferably lower than or equal to $1 \times 10^{18}$ atoms/cm$^3$.

8 Claims, 16 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236597 A1* | 9/2009 | Ye .................................. 257/43 |
| 2009/0278122 A1 | 11/2009 | Hosono et al. |
| 2009/0280600 A1 | 11/2009 | Hosono et al. |
| 2010/0025677 A1 | 2/2010 | Yamazaki et al. |
| 2010/0065844 A1 | 3/2010 | Tokunaga |
| 2010/0072467 A1 | 3/2010 | Yamazaki et al. |
| 2010/0092800 A1 | 4/2010 | Itagaki et al. |
| 2010/0109002 A1 | 5/2010 | Itagaki et al. |
| 2011/0006301 A1 | 1/2011 | Yamazaki et al. |
| 2011/0089416 A1 | 4/2011 | Yamazaki et al. |
| 2011/0215325 A1 | 9/2011 | Yamazaki et al. |
| 2011/0215331 A1 | 9/2011 | Yamazaki et al. |
| 2012/0132906 A1 | 5/2012 | Yamazaki |
| 2013/0082252 A1 | 4/2013 | Yamazaki |
| 2013/0099230 A1 | 4/2013 | Yamazaki et al. |
| 2013/0099233 A1 | 4/2013 | Tochibayashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 A | 9/2011 |
| JP | 2011-181801 A | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-202106-3.

Takahashi.M et al., "Theoretical Analysis of Igzo Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350°C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7,8,9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—0 TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID Interanational Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07 : SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YBFE2O4, and YB2FE3O7 Types of Structures for Compounds in the In2O3 and SC2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

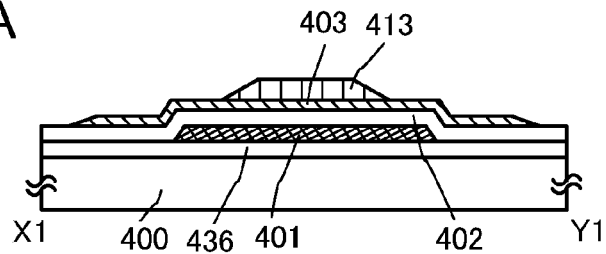
FIG. 2A
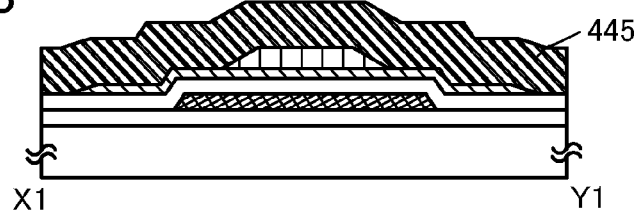
FIG. 2B
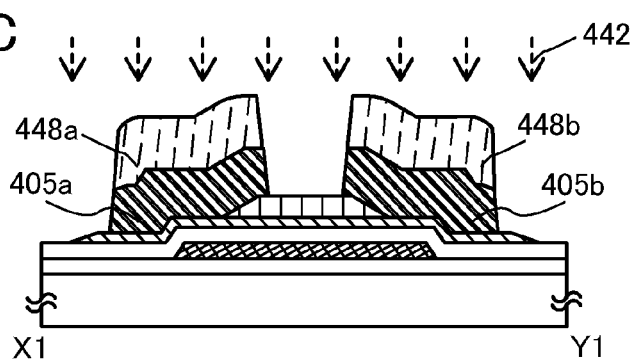
FIG. 2C
FIG. 2D
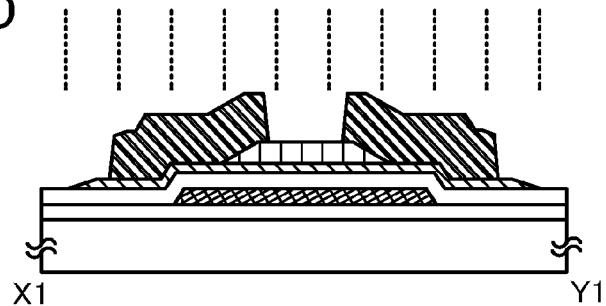
FIG. 2E
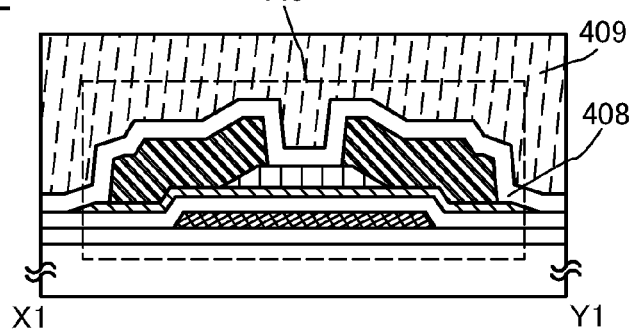

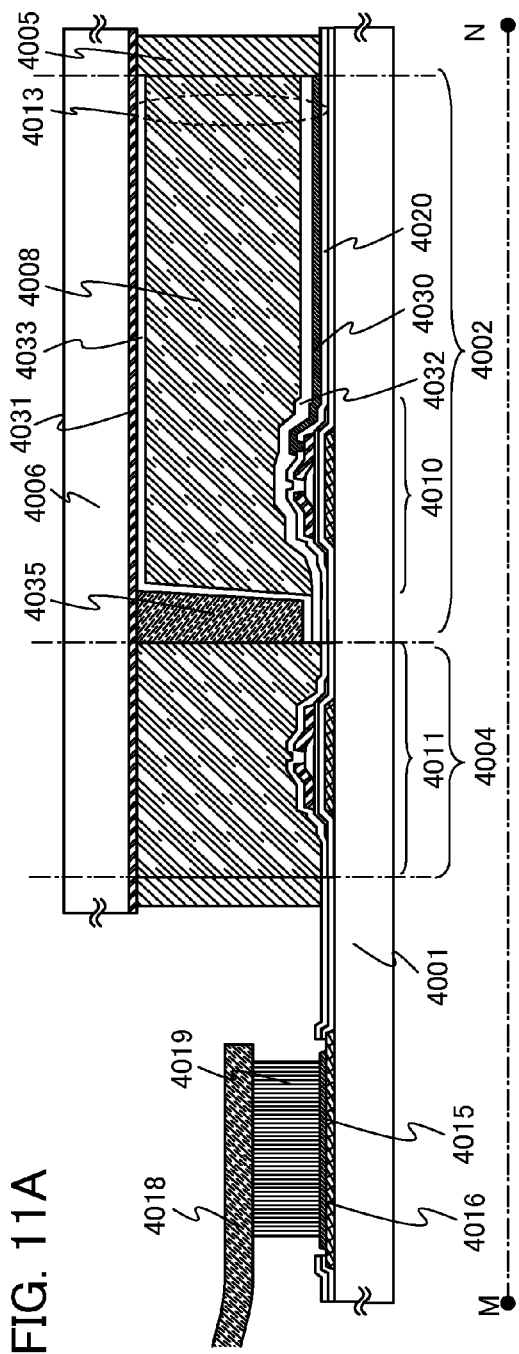
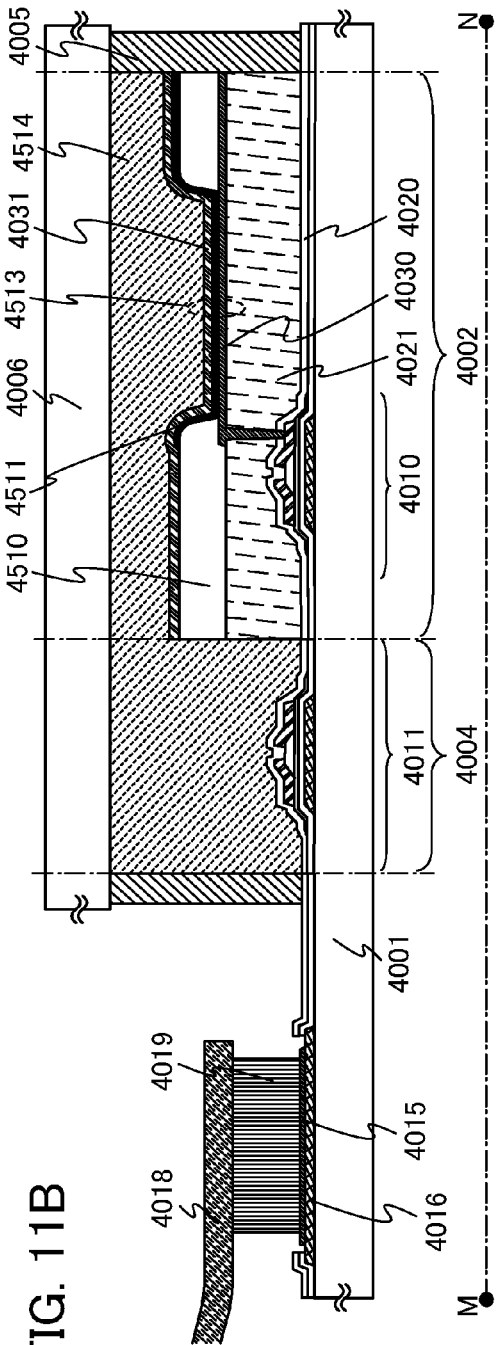
FIG. 11A
FIG. 11B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

Note that the semiconductor device in this specification refers to all devices that can function by utilizing semiconductor characteristics, and electro-optic devices, semiconductor circuits, and electronic appliances are all semiconductor devices.

2. Description of the Related Art

A technique by which transistors are formed using semiconductor thin films formed over a substrate having an insulating surface has been attracting attention. The transistors are applied to a wide range of semiconductor devices such as an integrated circuit (IC) and an image display device (also simply referred to as display device). A silicon-based semiconductor material is widely known as a material for a semiconductor thin film applicable to a transistor. As another material, an oxide semiconductor has been attracting attention.

For example, a transistor including a semiconductor layer formed of an amorphous oxide containing indium (In), gallium (Ga), and zinc (Zn) (an IGZO-based amorphous oxide) is disclosed (see Patent Document 1).

REFERENCE

Patent Document

[Patent Document 1] Japanese Published Patent Application No. 2011-181801

SUMMARY OF THE INVENTION

Improvement in reliability is important for commercialization of semiconductor devices including transistors formed using an oxide semiconductor.

However, a semiconductor device includes a plurality of thin films complicatedly stacked, and is manufactured using a variety of materials, methods, and steps. Therefore, an employed manufacturing process may cause shape defects or degradation of electric characteristics of a semiconductor device which is to be provided.

In view of the above problem, an object of one embodiment of the present invention is to provide a highly reliable semiconductor device which includes a transistor formed using an oxide semiconductor.

In a semiconductor device including a bottom-gate transistor in which an insulating layer functioning as a channel protective film is provided over an oxide semiconductor film, elements (e.g., chlorine and boron) contained in an etching gas which is used for forming the insulating layer provided over and in contact with the oxide semiconductor film and/or source and drain electrode layers are/is prevented from remaining as impurities on a surface of the oxide semiconductor film. Specifically, the following embodiment can be employed, for example.

One embodiment of the present invention is a method for manufacturing a semiconductor device, including the steps of: forming a gate electrode layer over an insulating surface; forming a gate insulating film over the gate electrode layer; forming an island-shaped oxide semiconductor film over the gate insulating film; forming an insulating layer overlapping with the gate electrode layer and in contact with the island-shaped oxide semiconductor film; forming a conductive film covering the island-shaped oxide semiconductor film and the insulating layer; processing the conductive film by plasma treatment using an etching gas containing a halogen element to form a source electrode layer and a drain electrode layer, so that part of the oxide semiconductor film is exposed; and performing impurity-removing treatment on the exposed oxide semiconductor film to remove the element contained in the etching gas.

One embodiment of the present invention is a method for manufacturing a semiconductor device, including the steps of: forming a gate electrode layer over an insulating surface; forming a gate insulating film over the gate electrode layer; forming an island-shaped oxide semiconductor film over the gate insulating film; forming an insulating layer covering the island-shaped oxide semiconductor film; processing the insulating layer by plasma treatment using an etching gas containing a halogen element to form an insulating layer functioning as a channel protective film in a position overlapping with the gate electrode layer; performing impurity-removing treatment on the oxide semiconductor film to remove the element contained in the etching gas; forming a conductive film covering the island-shaped oxide semiconductor film and the insulating layer functioning as the channel protective film; and processing the conductive film to form a source electrode layer and a drain electrode layer covering edge portions of the oxide semiconductor film in a channel width direction.

In the method for manufacturing a semiconductor device, a chlorine concentration in a surface of the oxide semiconductor film subjected to the impurity-removing treatment is preferably lower than or equal to $5 \times 10^{18}$ atoms/cm$^3$.

In the method for manufacturing a semiconductor device, oxygen plasma treatment, dinitrogen monoxide plasma treatment, or cleaning treatment with a diluted hydrofluoric acid solution can be performed as the impurity-removing treatment.

One embodiment of the present invention is a method for manufacturing a semiconductor device, including the steps of: forming a gate electrode layer over an insulating surface; forming a gate insulating film over the gate electrode layer; forming an island-shaped oxide semiconductor film over the gate insulating film; forming an insulating layer covering the island-shaped oxide semiconductor film; processing the insulating layer by plasma treatment using an etching gas containing a halogen element to form an insulating layer functioning as a channel protective film in a position overlapping with the gate electrode layer; performing first impurity-removing treatment on the oxide semiconductor film to remove the element contained in the etching gas; forming a conductive film covering the island-shaped oxide semiconductor film and the insulating layer functioning as the channel protective film; processing the conductive film by plasma treatment using an etching gas containing a halogen element to form a source electrode layer and a drain electrode layer, so that part of the oxide semiconductor film is exposed; and performing second impurity-removing treatment on the exposed oxide semiconductor film to remove the element contained in the etching gas.

One embodiment of the present invention is a semiconductor device including a gate electrode layer provided over an insulating surface, a gate insulating film provided over the gate electrode layer, an island-shaped oxide semiconductor film provided over the gate insulating film, an insulating layer provided over the oxide semiconductor film and overlapping with the gate electrode layer, and a source electrode layer and a drain electrode layer in contact with the oxide semiconductor film and the insulating layer. In the semiconductor device, a length of each of the source electrode layer and the drain electrode layer in the channel width direction is smaller than a length of the oxide semiconductor film in the channel width direction, and a chlorine concentration in a surface of the oxide semiconductor film is lower than or equal to $5\times10^{18}$ atoms/cm$^3$.

In the semiconductor device, a region of the oxide semiconductor film which overlaps with the insulating layer, the source electrode layer, or the drain electrode layer may have a larger thickness than a region of the oxide semiconductor film which does not overlap with any of the insulating layer, the source electrode layer, or the drain electrode layer.

Further, in the semiconductor device, any region of the oxide semiconductor film overlaps with at least one of the insulating layer, the source electrode layer, and the drain electrode layer.

One embodiment of the present invention is a semiconductor device including a gate electrode layer provided over an insulating surface, a gate insulating film provided over the gate electrode layer, an island-shaped oxide semiconductor film provided over the gate insulating film, an insulating layer provided over the oxide semiconductor film and overlapping with the gate electrode layer, and a source electrode layer and a drain electrode layer in contact with the oxide semiconductor film and the insulating layer. In the semiconductor device, the source electrode layer and the drain electrode layer cover edge portions of the oxide semiconductor film in a channel width direction, and a chlorine concentration in a surface of the oxide semiconductor film is lower than or equal to $5\times10^{18}$ atoms/cm$^3$.

In the semiconductor device, a region of the oxide semiconductor film which overlaps with the insulating layer may have a larger thickness than a region of the oxide semiconductor film which overlaps with the source electrode layer or the drain electrode layer.

Plasma treatment using an etching gas containing a halogen element is favorably employed for pattern formation of a film which is over and in contact with an oxide semiconductor film, such as an insulating layer functioning as a channel formation region, a source electrode layer, or a drain electrode layer. However, if the oxide semiconductor film is exposed to the etching gas containing a halogen element, oxygen in the oxide semiconductor film is extracted by the halogen element (e.g., chlorine or fluorine) contained in the etching gas in some cases, which might cause oxygen vacancies to be formed in the vicinity of an interface of the oxide semiconductor film. Such oxygen vacancies in the oxide semiconductor film might cause a backchannel of the oxide semiconductor film to have lower resistance (n-type conductivity), resulting in formation of a parasitic channel.

For example, in the case where an oxide semiconductor material containing indium is used for the oxide semiconductor film and an etching gas containing boron trichloride (BCl$_3$) is used for processing the source electrode layer and the drain electrode layer which are provided in contact with the oxide semiconductor film, an In—O—In bond in the oxide semiconductor film and Cl contained in the etching gas sometimes react with each other, so that a film including an In—Cl bond and an In element from which oxygen is detached may be formed. Since the In element from which oxygen is detached has a dangling bond, an oxygen vacancy exists in the portion of the oxide semiconductor film, from which oxygen is detached.

Further, in the case where the etching gas containing a halogen element also contains an element (e.g., boron) that is not halogen, the element that is not halogen can cause the backchannel of the oxide semiconductor film to have lower resistance (n-type conductivity).

According to one embodiment of the present invention, after the insulating layer and/or the source electrode layer and the drain electrode layer which are provided over the oxide semiconductor film are formed by etching processing, impurity-removing treatment is performed; thus, elements (e.g., chlorine and boron) that are contained in an etching gas and can cause the oxide semiconductor film to have lower resistance are removed. Accordingly, the reliability of the semiconductor device can be improved.

A highly reliable semiconductor device which includes a transistor including an oxide semiconductor is provided.

BRIEF DESCRIPTION OF THE DRAWINGS

FIGS. 2A to 2E are cross-sectional views illustrating one embodiment of a method for manufacturing a semiconductor device.

FIGS. 11A and 11B are cross-sectional views each illustrating one embodiment of a semiconductor device.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, an embodiment of a semiconductor device and a manufacturing method thereof will be described with reference to FIGS. 1A to 1C, FIGS. 2A to 2E, FIGS. 3A to 3C, FIGS. 4A to 4C, and FIGS. 5A to 5C. In this embodiment, a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
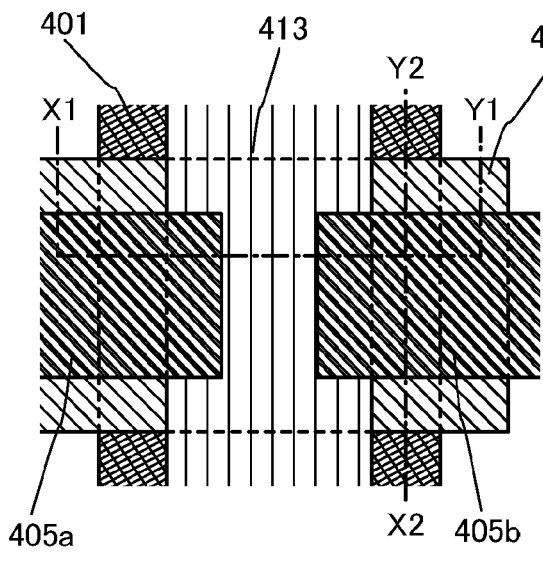
FIGS. 1A to 1C are a plan view and cross-sectional views illustrating one embodiment of a semiconductor device.
Figure 1C:
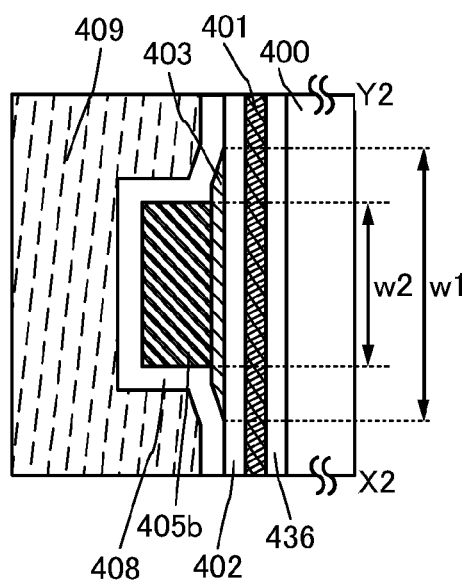
Figure 1B:
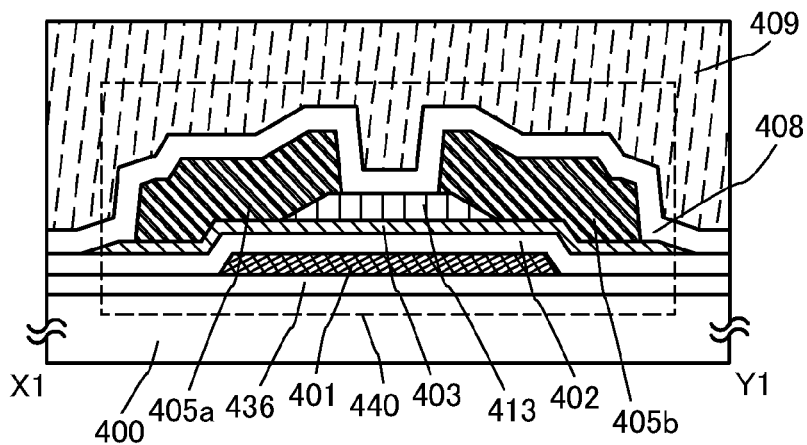

A transistor 440 illustrated in FIGS. 1A to 1C is an example of a transistor which is one of bottom-gate transistors and is also referred to as an inverted staggered transistor. FIG. 1A is a plan view of the transistor 440. FIG. 1B is a cross-sectional view taken along line X1-Y1 in FIG. 1A. FIG. 1C is a cross-sectional view taken along line X2-Y2 in FIG. 1A.

The transistor 440 illustrated in FIGS. 1A to 1C includes a gate electrode layer 401 which is provided over a substrate 400 having an insulating surface, a gate insulating film 402 which is provided over the gate electrode layer 401, an oxide semiconductor film 403 which has an island shape and is provided over the gate insulating film 402, an insulating layer 413 which is provided over the oxide semiconductor film 403 and overlaps with the gate electrode layer 401, and a source electrode layer 405a and a drain electrode layer 405b which are in contact with the oxide semiconductor film 403 and the insulating layer 413. In addition, the transistor 440 may further include, as its components, a base insulating film 436 which is provided over the substrate 400, and an interlayer insulating film 408 and a planarization insulating film 409 which cover the transistor 440.

In the transistor 440, a length w2 of each of the source electrode layer 405a and the drain electrode layer 405b in the channel width direction is smaller than a length w1 of the oxide semiconductor film 403 in the channel width direction, and part of a surface of the oxide semiconductor film 403 is in contact with the interlayer insulating film 408.

The oxide semiconductor film 403 is subjected to impurity-removing treatment in the manufacturing process of the transistor 440; therefore, elements contained in an etching gas which is used for forming the source electrode layer 405a, the drain electrode layer 405b, and the like which are provided over and in contact with the oxide semiconductor film 403 hardly remain on the surface of the oxide semiconductor film 403. Specifically, each of the chlorine concentration and the boron concentration in the surface of the oxide semiconductor film 403 is lower than or equal to $5 \times 10^{18}$ atoms/cm$^3$, preferably lower than or equal to $1 \times 10^{18}$ atoms/cm$^3$.

An oxide semiconductor used for the oxide semiconductor film 403 contains at least indium (In). In particular, In and zinc (Zn) are preferably contained. In addition, as a stabilizer for reducing the variation in electric characteristics of a transistor using the oxide semiconductor film, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0; and m is not an integer) may be used as the oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0 and n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=1:3:2 (=1/6:1/2:1/3), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

However, without limitation to the materials given above, a material with an appropriate composition may be used as the oxide semiconductor depending on needed semiconductor characteristics and electrical characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like are set to appropriate values. Alternatively, oxide semiconductor films which have different constitutions (typified by composition) may be stacked or may be separately provided as the channel formation region and source and drain regions as appropriate.

For example, the oxide semiconductor film 403 may be a stack in which a first oxide semiconductor film, a second oxide semiconductor film, and a third oxide semiconductor film which have different compositions are provided in this order. For example, the first oxide semiconductor film and the third oxide semiconductor film may be formed using a three-component metal oxide, and the second oxide semiconductor film may be formed using a two-component metal oxide. It is preferable that the first to third oxide semiconductor films are formed using materials which contain the same components. In the case where the materials containing the same components are used, the second oxide semiconductor film can be formed over the first oxide semiconductor film using a crystal layer of the first oxide semiconductor film as a seed; therefore, crystal growth of the second oxide semiconductor film can be easily caused. The same applies to the third oxide semiconductor film. In addition, in the case where the materials containing the same components are used, an interface property such as adhesion or electric characteristics is good.

Further, the first oxide semiconductor film, the second oxide semiconductor film, and the third oxide semiconductor film may contain the same constituent elements and the composition of the constituent elements may be different among the first oxide semiconductor film, the second oxide semiconductor film, and the third oxide semiconductor film. For example, the first oxide semiconductor film and the third oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may have an atomic ratio of In:Ga:Zn=1:3:2, and the second oxide semiconductor film may have an atomic ratio of In:Ga:Zn=3:1:2. Further alternatively, the first oxide semiconductor film may have an atomic ratio of In:Ga:Zn=1:3:2, the second oxide semiconductor film may have an atomic ratio of In:Ga:Zn=3:1:2, and the third oxide semiconductor film may have an atomic ratio of In:Ga:Zn=1:1:1.

The oxide semiconductor film 403 is in a single crystal state, a polycrystalline (also referred to as polycrystal) state, an amorphous state, or the like.

The oxide semiconductor film 403 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal portion is the direction parallel to a normal vector of the surface where the CAAC-OS film is formed or a normal vector of the surface of the CAAC-OS film. The crystal portion is formed by deposition or by performing treatment for crystallization such as heat treatment after deposition.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness (Ra) of less than or equal to 1 nm, preferably less than or equal to 0.3 nm, further preferably less than or equal to 0.1 nm.

The average surface roughness (Ra) is obtained by expanding, into three dimensions, arithmetic mean surface roughness that is defined by JIS B 0601:2001 (ISO4287:1997) so as to be able to apply to a curved surface, and can be expressed as an "average value of the absolute values of deviations from a reference surface to a designated surface" and is defined by the following formula:

$$Ra = \frac{1}{S_0} \int_{y_1}^{y_2} \int_{x_1}^{x_2} |f(x, y) - Z_0| dx dy \qquad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Ra can be measured using an atomic force microscope (AFM).

Note that, since the transistor 440 described in this embodiment is a bottom-gate transistor, the substrate 400, the gate electrode layer 401, and the gate insulating film 402 are positioned below the oxide semiconductor film 403. Accordingly, planarization treatment such as CMP treatment may be performed after the formation of the gate electrode layer 401 and the gate insulating film 402 to obtain the above flat surface.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor film 403 may be formed using a sputtering apparatus which performs deposition with surfaces of a plurality of substrates set substantially perpendicular to a surface of a sputtering target (a columnar plasma sputtering system).

Next, an example of a method for manufacturing the transistor 440 shown in FIGS. 1A to 1C is described with reference to FIGS. 2A to 2E.

First, the base insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440 including the oxide semiconductor film 403 may be directly formed over a flexible substrate; or alternatively, the transistor 440 including the oxide semiconductor film 403 may be formed over a substrate, and then may be separated and transferred to a flexible substrate. Note that in order to separate the transistor 440 including the oxide semiconductor film from the manufacturing substrate and transfer it to the flexible substrate, a separation layer may be provided between the manufacturing substrate and the transistor 440.

The base insulating film 436 can be formed by a plasma CVD method, a sputtering method, or the like using an oxide insulating material such as silicon oxide, silicon oxynitride, aluminum oxide, aluminum oxynitride, hafnium oxide, gallium oxide, or the like; a nitride insulating material such as silicon nitride, silicon nitride oxide, an aluminum nitride, aluminum nitride oxide, or the like; or a mixed material thereof. Note that the base insulating film 436 is not necessarily provided.

The substrate 400 (or the substrate 400 and the base insulating film 436) may be subjected to heat treatment. For example, the heat treatment may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to 1 hour.

Then, a conductive film is formed over the base insulating film 436 and etched to form the gate electrode layer 401 (including a wiring formed using the same layer). Note that the etching of the conductive film may be performed using either dry etching or wet etching, or using both dry etching and wet etching.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As the gate electrode layer 401, which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the gate electrode layer, so that a switching element of what is called normally-off type can be realized.

In this embodiment, a 100-nm-thick tungsten film is formed by a sputtering method.

After the formation of the gate electrode layer 401, the substrate 400 and the gate electrode layer 401 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to 1 hour.

Next, the gate insulating film 402 is formed over the gate electrode layer 401.

To improve the coverage with the gate insulating film 402, planarization treatment may be performed on a surface of the gate electrode layer 401. It is preferable that the flatness of the surface of the gate electrode layer 401 is good particularly when the thickness of the gate insulating film 402 is small.

The gate insulating film 402 can be formed to have a thickness greater than or equal to 1 nm and less than or equal to 20 nm by a sputtering method, an MBE method, a CVD method, a pulsed laser deposition method, an ALD method, or the like as appropriate. The gate insulating film 402 may be formed with a sputtering apparatus which performs deposition on surfaces of a plurality of substrates set substantially perpendicular to a surface of a sputtering target.

As a material of the gate insulating film 402, a silicon oxide film, a gallium oxide film, an aluminum oxide film, a silicon nitride film, a silicon oxynitride film, an aluminum oxynitride film, or a silicon nitride oxide film can be used.

When the gate insulating film 402 is formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide, gate leakage current can be reduced. Further, the gate insulating film 402 may have either a single-layer structure or a stacked-layer structure.

It is preferable that the gate insulating film 402 includes oxygen in a portion which is in contact with the oxide semiconductor film 403. In particular, the gate insulating film 402 preferably contains a large amount of oxygen which exceeds at least the stoichiometric composition in the film (bulk). For example, in the case where a silicon oxide film is used as the gate insulating film 402, the composition formula is $SiO_{2+\alpha}$, ($\alpha>0$).

When the gate insulating film 402 containing much (excess) oxygen, which serves as an oxygen supply source, is provided so as to be in contact with the oxide semiconductor film 403, oxygen can be supplied from the gate insulating film 402 to the oxide semiconductor film 403. Heat treatment may be performed in the state where the oxide semiconductor film 403 and the gate insulating film 402 are at least partly in contact with each other to supply oxygen to the oxide semiconductor film 403.

By supply of oxygen to the oxide semiconductor film 403, oxygen vacancies in the film can be repaired. Further, the gate insulating film 402 is preferably formed in consideration of the size of a transistor to be formed and the step coverage with the gate insulating film 402.

In this embodiment, a 200-nm-thick silicon oxynitride film is formed by a high-density plasma CVD method.

After the formation of the gate insulating film 402, the substrate 400, the gate electrode layer 401, and the gate insulating film 402 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to 1 hour.

Next, the oxide semiconductor film 403 is formed over the gate insulating film 402.

In order that hydrogen or water will not enter the oxide semiconductor film 403 as much as possible in the formation step of the oxide semiconductor film 403, it is preferable to heat the substrate provided with the gate insulating film 402 in a preheating chamber in a sputtering apparatus as a pretreatment for formation of the oxide semiconductor film 403 so that impurities such as hydrogen and moisture adsorbed onto the substrate and the gate insulating film 402 are eliminated and exhausted. As an exhaustion unit provided in the preheating chamber, a cryopump is preferable.

Planarizing treatment may be performed on the region of the gate insulating film 402 which is in contact with the oxide semiconductor film 403. As the planarization treatment, polishing treatment (e.g., chemical mechanical polishing (CMP) method), dry-etching treatment, or plasma treatment can be used, though there is no particular limitation on the planarizing treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the top surface of the gate insulating film 402.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the gate insulating film 402.

The oxide semiconductor film 403 is preferably deposited under a condition such that much oxygen is contained (for example, by a sputtering method in an atmosphere where the proportion of oxygen is 100%) so as to be a film containing much oxygen (preferably including a region containing excessive oxygen as compared to the stoichiometric composition of the oxide semiconductor in a crystalline state).

In this embodiment, a 35-nm-thick In—Ga—Zn-based oxide film (IGZO film) is formed as the oxide semiconductor film 403 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the deposition condition is as follows: the atmosphere is an atmosphere of oxygen and argon (oxygen flow rate: 50%), the pressure is 0.6 Pa, the power of the power source is 5 kW, and the substrate temperature is 170° C. The deposition rate under the deposition condition is 16 nm/min.

It is preferable that a high-purity gas from which an impurity such as hydrogen, water, a hydroxyl group, or hydride is removed is used as a sputtering gas for the deposition of the oxide semiconductor film 403.

The substrate is held in a deposition chamber kept under reduced pressure. Then, a sputtering gas from which impurities such as hydrogen and moisture are sufficiently removed is introduced into the deposition chamber from which remaining moisture is being removed, and the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

It is preferable to form the gate insulating film 402 and the oxide semiconductor film 403 in succession so as not to expose the gate insulating film 402 to the air. Forming the gate insulating film 402 and the oxide semiconductor film 403 in succession so as not to expose the gate insulating film 402 to the air can prevent impurities such as hydrogen and moisture from being adsorbed to the surface of the gate insulating film 402.

In the case where a CAAC-OS film is used as the oxide semiconductor film 403, for example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby a crystal state of the sputtering target is transferred to the substrate. As a result, the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing a substrate heating temperature during the deposition, migration of a sputtered particle is likely to occur after the sputtered particle reaches a substrate surface. Specifically, the substrate heating temperature during the deposition is set to higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas is increased and the power is optimized in order to reduce plasma damage at the deposition. The proportion of oxygen in the deposition gas is greater than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The oxide semiconductor film 403 can be formed by processing an oxide semiconductor film into an island shape by a photolithography process.

A resist mask for forming the oxide semiconductor film 403 having an island shape may be formed by an inkjet method. Formation of the resist mask by an inkjet method needs no photomask; thus, manufacturing cost can be reduced.

Etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, etching may be performed by a dry etching employing an inductively coupled plasma (ICP) etching method.

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like.

When a crystalline oxide semiconductor film is used as the oxide semiconductor film 403, heat treatment for crystallization may be performed.

In this embodiment, the substrate is introduced into an electric furnace, which is one of heat treatment apparatuses, and the oxide semiconductor film 403 is subjected to heat treatment at 450° C. in a nitrogen atmosphere for 1 hour and further at 450° C. in an atmosphere of nitrogen and oxygen for 1 hour.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that moisture, hydrogen, and the like are not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like is not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step for removing an impurity for the dehydration or dehydrogenation, so that the oxide semiconductor film 403 can be a highly purified, i-type (intrinsic) oxide semiconductor film.

Note that the timing of the heat treatment for dehydration or dehydrogenation may be after formation of the oxide semiconductor film or after formation of the oxide semiconductor film 403 having an island shape.

The heat treatment for dehydration or dehydrogenation may be performed plural times and may be combined with another heat treatment.

When the heat treatment for dehydration or dehydrogenation is performed in the state where the gate insulating film 402 is covered with the oxide semiconductor film 403 which has not been processed into an island-shaped shape, oxygen contained in the gate insulating film 402 can be prevented from being released by the heat treatment, which is preferable.

Further or alternatively, oxygen (which includes at least one of an oxygen radical, an oxygen atom, and an oxygen ion) may be introduced to the oxide semiconductor film 403 which has been subjected to the dehydration or dehydrogenation treatment to supply oxygen to the oxide semiconductor film.

The dehydration or dehydrogenation treatment may be accompanied by elimination of oxygen which is a main component material of an oxide semiconductor to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy.

Therefore, it is preferable that oxygen (which includes at least one of an oxygen radical, an oxygen atom, and an oxygen ion) is added to the oxide semiconductor film which has been subjected to the dehydration or dehydrogenation treatment to supply oxygen to the oxide semiconductor film. By supply of oxygen to the oxide semiconductor film, oxygen vacancies in the film can be repaired.

Oxygen which is introduced to the dehydrated or dehydrogenated oxide semiconductor film 403 to supply oxygen to the film can highly purify the oxide semiconductor film 403 and make the film an i-type (intrinsic). Variation in electric characteristics of the transistor including the i-type (intrinsic) oxide semiconductor film 403 is suppressed, and the transistor is electrically stable.

Oxygen can be introduced by an ion implantation method, an ion doping method, a plasma immersion ion implantation method, plasma treatment, or the like.

In the case where oxygen is introduced into the oxide semiconductor film 403, oxygen may be directly introduced into the oxide semiconductor film 403, or may be introduced into the oxide semiconductor film 403 through other films such as an insulating layer 413. An ion implantation method, an ion doping method, a plasma immersion ion implantation method, or the like may be employed for the introduction of oxygen through another film, whereas plasma treatment or the like can also be employed for the introduction of oxygen directly into the oxide semiconductor film 403 which is exposed.

The introduction of oxygen to the oxide semiconductor film 403 is preferably performed anytime after dehydration or dehydrogenation treatment is performed thereon, but the timing is not limited thereto. Further, oxygen may be introduced plural times into the dehydrated or dehydrogenated oxide semiconductor film 403.

Further, it is preferable that the oxide semiconductor film provided in the transistor includes a region containing excessive oxygen as compared to the stoichiometric composition of the oxide semiconductor in a crystalline state. In that case, the oxygen content is preferably higher than that in the stoichiometric ratio of the oxide semiconductor. Alternatively, the oxygen content is higher than that of the oxide semiconductor in a single crystal state. In some cases, oxygen may exist between lattices of the oxide semiconductor.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film for a transistor, fluctuation in the threshold voltage Vth of the transistor due to an oxygen vacancy and a shift of the threshold voltage ΔVth can be reduced.

Next, the insulating layer 413 is formed over the channel formation region of the oxide semiconductor film 403 which overlaps with the gate electrode layer 401 (see FIG. 2A).

The insulating layer 413 can be formed by etching of an insulating film which is deposited by a plasma CVD method or a sputtering method. As the insulating layer 413, a single layer or a stack of one or more inorganic insulating films, typical examples of which include a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

When the insulating layer 413 in contact with the oxide semiconductor film 403 (or a film in contact with the oxide semiconductor film 403 in the case where the insulating layer 413 has a stacked-layer structure) contains a large amount of oxygen, the insulating layer 413 (or the film in contact with the oxide semiconductor film 403) can favorably function as a supply source which supplies oxygen to the oxide semiconductor film 403.

In this embodiment, a 200-nm-thick silicon oxide film is formed as the insulating layer 413 by a sputtering method. The silicon oxide film is selectively etched to form the insulating layer 413 whose cross-sectional shape is a trapezoid or a triangle and in which a taper angle of a bottom edge portion of the cross-sectional shape is less than or equal to 60°, preferably less than or equal to 45°, further preferably less than or equal to 30°. Note that the planar shape of the insulating layer 413 is a rectangle. In this embodiment, a resist mask is formed over the silicon oxide film through a photolithography process and selective etching is performed, so that the taper angle of the bottom edge portion of the insulating layer 413 is approximately 30°.

After the formation of the insulating layer 413, heat treatment may be performed. In this embodiment, heat treatment is performed at 300° C. for 1 hour in a nitrogen atmosphere.

Next, a conductive film 445 to be a source electrode layer and a drain electrode layer (including a wiring formed using the same layer) is formed over the gate electrode layer 401, the gate insulating film 402, the oxide semiconductor film 403, and the insulating layer 413 (see FIG. 2B).

The conductive film 445 is formed of a material that can withstand heat treatment performed later. As the conductive film 445 used for forming the source electrode layer and the drain electrode layer, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. Alternatively, the conductive film 445 used for forming the source electrode layer and the drain electrode layer may be formed using a conductive metal oxide. Examples of the conductive metal oxide are indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), and any of these metal oxide materials containing silicon oxide.

Resist masks 448a and 448b are formed over the conductive film 445 through a photolithography process and selective etching is performed, so that the source electrode layer 405a and the drain electrode layer 405b are formed (see FIG. 2C). After the source electrode layer 405a and the drain electrode layer 405b are formed, the resist masks are removed.

A gas 442 containing a halogen element is used for the etching of the conductive film 445. A gas containing sulfur hexafluoride ($SF_6$), carbon tetrafluoride ($CF_4$), chlorine ($Cl_2$), boron trichloride ($BCl_3$), silicon tetrachloride ($SiCl_4$), carbon tetrachloride ($CCl_4$), or the like can be used as the gas 442 containing the halogen element.

A reactive ion etching (RIE) method or an ICP etching method can be used as the etching method. In order to etch the film into desired shapes, the etching conditions (the amount of electric power applied to a coil-shaped electrode, the amount of electric power applied to an electrode on a substrate side, the temperature of the electrode on the substrate side, or the like) is adjusted as appropriate.

In this embodiment, a stack of a 100-nm-thick titanium film, a 400-nm-thick aluminum film, and a 100-nm-thick titanium film is formed as the conductive film 445 by a sputtering method. As the etching of the conductive film 445, the stack of the titanium film, the aluminum film, and the titanium film is etched by a dry etching method, whereby the source electrode layer 405a and the drain electrode layer 405b are formed.

In this embodiment, the upper titanium film and the aluminum film are etched under a first etching condition and then the lower titanium film is etched under a second etching condition. The first etching condition is as follows: an etching gas ($BCl_3$:$Cl_2$=750 sccm:150 sccm) is used, the bias power is 1500 W, the power of an ICP power source is 0 W, and the pressure is 2.0 Pa. The second etching condition is as follows: an etching gas ($BCl_3$:$Cl_2$=700 sccm:100 sccm) is used, the bias power is 750 W, the power of the ICP power source is 0 W, and the pressure is 2.0 Pa.

One of edge portions of the source electrode layer 405a in the channel length direction is located over a top surface or a side surface of the insulating layer 413, and one of edge portions of the drain electrode layer 405b in the channel length direction is located over the top surface or a side surface of the insulating layer 413. In addition, as illustrated in FIGS. 1A and 1C, the length w1 of the oxide semiconductor film 403 in the channel width direction is larger than the length w2 of each of the source electrode layer 405a and the drain electrode layer 405b in the channel width direction. Therefore, edge portions of the source electrode layer 405a in the channel width direction are located over the oxide semiconductor film 403, and edge portions of the drain electrode layer 405b in the channel width direction are located over the oxide semiconductor film 403. Therefore, part of the oxide semiconductor film 403 (regions which do not overlap with any of the source electrode layer 405a, the drain electrode layer 405b, or the insulating layer 413) is exposed to a gas 442 containing a halogen element at the time when the conductive film 445 is etched to form the source electrode layer 405a and the drain electrode layer 405b.

When the oxide semiconductor film 403 is exposed to the gas 442 containing the halogen element and the halogen element contained in the etching gas remains on the surface of the oxide semiconductor film 403, oxygen in the oxide semiconductor film 403 might be extracted by the halogen element, so that oxygen vacancies are formed in the periphery of the interface of the oxide semiconductor film 403 in some cases. In addition, an element (e.g., boron) which is not a halogen element and is contained in the etching gas containing the halogen element might also cause the back channel of the oxide semiconductor film 403 to have lower resistance (n-type conductivity).

Therefore, after the source electrode layer 405a and the drain electrode layer 405b are formed, impurities on the surface of the oxide semiconductor film 403 and on the periphery thereof (here, the elements contained in the etching gas) are removed (see FIG. 2D). The impurity-removing treatment can be performed by treatment with a solution or plasma treatment using oxygen or dinitrogen monoxide. As the solution, water, an alkaline solution (e.g., a developing solution or an ammonia hydrogen peroxide mixture), an acid solution (e.g., diluted hydrofluoric acid (hydrofluoric acid which is diluted at a ratio of 1:100 (0.5% hydrofluoric acid), preferably at a ratio of $1:10^3$ or more and $1:10^5$ or less)) can be preferably used. In addition, as the impurity-removing treatment, the above treatments may be performed in combination. For example, plasma treatment using oxygen may be performed and then treatment using diluted hydrofluoric acid may be performed.

Figure 15:
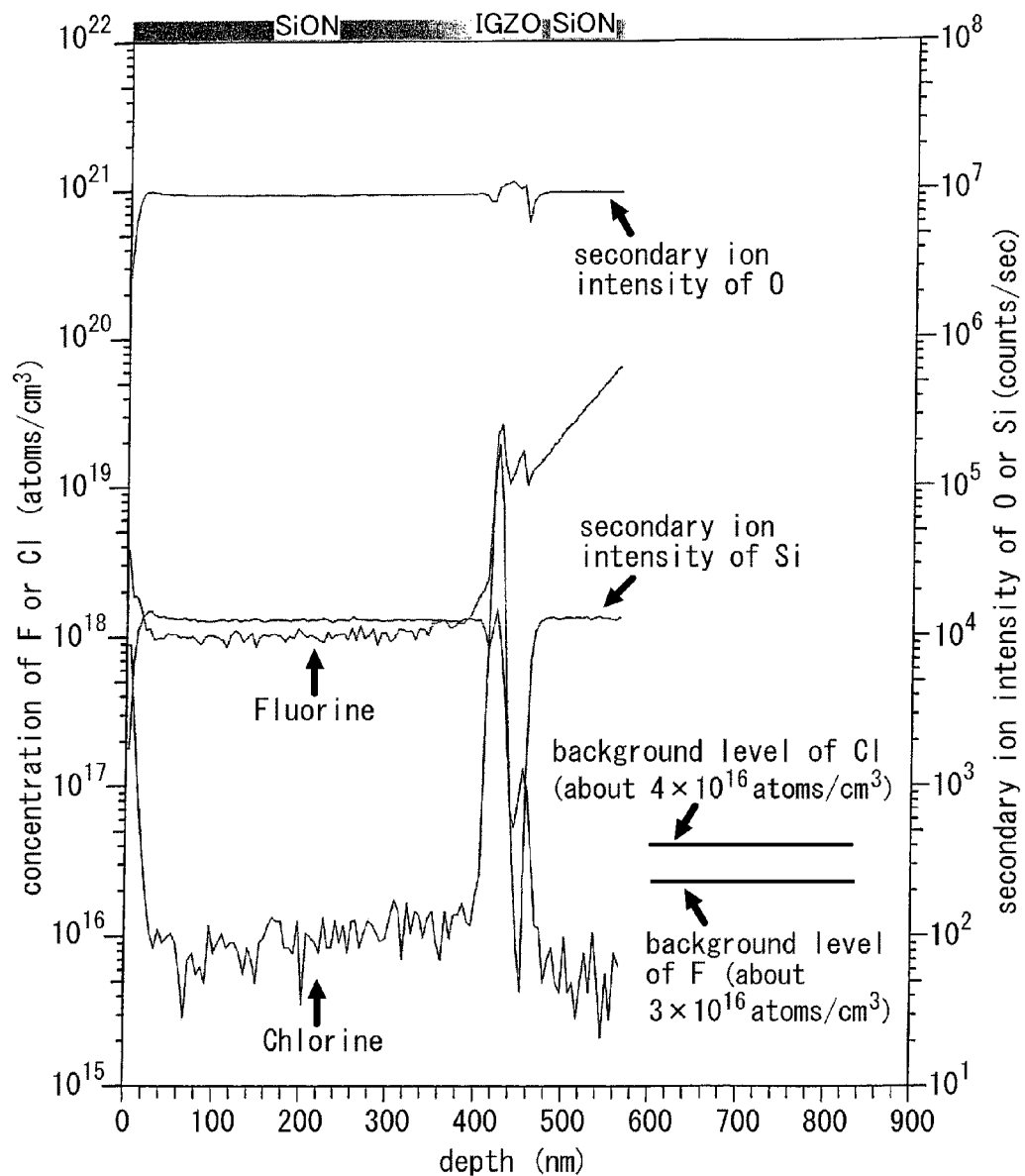
FIG. 15 shows measurement results by SIMS.

FIG. 15 shows measurement results by secondary ion mass spectrometry (SIMS) in which the chlorine concentration in an oxide semiconductor film of a transistor which was manufactured without cleaning treatment was measured. The sample transistor has the same structure as the transistor 440 of this embodiment except that the cleaning treatment is not performed, and the sample transistor was manufactured using the same material and method as the transistor 440. Note that a region where an insulating layer functioning as a channel protective film was not formed was measured. In the region, a silicon oxynitride film (with a thickness of 400 nm) serving as a protective insulating film, an IGZO film serving as an oxide semiconductor film, and a silicon oxynitride film serving as a gate insulating film are stacked toward the depth direction. The measurement was performed from the protective insulating film toward the depth direction.

FIG. 15 shows that the chlorine concentration in the IGZO film serving as the oxide semiconductor film is higher than $1 \times 10^{19}$ atoms/$cm^3$, which indicates that the oxide semiconductor film contains chlorine.

In this embodiment, the oxide semiconductor film 403 which is exposed to the etching gas is subjected to the impurity-removing treatment after the source electrode layer 405a and the drain electrode layer 405b are formed, whereby the elements (e.g., chlorine and boron) contained in the etching gas can be removed. For example, in the surface of the oxide semiconductor film 403 which has been subjected to the impurity-removing treatment, the chlorine concentration and the boron concentration each can be lower than or equal to $5 \times 10^{18}$ atoms/$cm^3$ (preferably lower than or equal to $1 \times 10^{18}$ atoms/$cm^3$).

Through the above-described process, the transistor 440 of this embodiment can be manufactured (see FIG. 2E).

Note that the interlayer insulating film 408 covering the transistor 440 and the planarization insulating film 409 for reducing surface unevenness which is caused by the transistor 440 may be provided.

The interlayer insulating film 408 can be formed using the same material and method as the insulating layer 413. For example, a 400-nm-thick silicon oxynitride film is formed as the interlayer insulating film 408 by a CVD method. In addition, heat treatment may be performed after the interlayer insulating film 408 is formed. For example, the heat treatment is performed at 300° C. for 1 hour in a nitrogen atmosphere.

Further, a dense inorganic insulating film may be provided as the interlayer insulating film 408. For example, an aluminum oxide film is formed as the interlayer insulating film 408 by a sputtering method. When the aluminum oxide film has high density (the film density is higher than or equal to 3.2 $g/cm^3$, preferably higher than or equal to 3.6 $g/cm^3$), the transistor 440 can have stable electric characteristics. The film density can be measured by Rutherford backscattering spectrometry (RBS) or X-ray reflectometry (XRR).

An aluminum oxide film which can function as a protective insulating film of the transistor 440 has a high shielding effect (blocking effect) of preventing penetration of both oxygen and impurities such as hydrogen and moisture.

Therefore, in and after the manufacturing process, the aluminum oxide film prevents the entry of impurities such as hydrogen and moisture, which causes a change, into the oxide semiconductor film 403 and release of oxygen, which is a main component material of the oxide semiconductor, from the oxide semiconductor film 403.

As the planarization insulating film 409, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

For example, a 1500-nm-thick acrylic resin film may be formed as the planarization insulating film 409. The acrylic resin film can be formed in such a manner that an acrylic resin is applied by a coating method and then baked (e.g., at 250° C. in a nitrogen atmosphere for 1 hour).

Heat treatment may be performed after the planarization insulating film 409 is formed. For example, heat treatment is performed at 250° C. for 1 hour in a nitrogen atmosphere.

In this manner, the heat treatment may be performed after the transistor 440 is formed. Further, the heat treatment may be performed more than once.

As described above, the impurity-removing treatment for removing the elements contained in the etching gas can prevent oxygen from being extracted from the surface of the oxide semiconductor film 403 and the periphery thereof by the halogen element contained in the etching gas, or can prevent a reduction in the resistance of the back channel of the oxide semiconductor film 403 (prevent the back channel from having n-type conductivity) by the element which is not a halogen element and contained in the etching gas. As a result, the use of the oxide semiconductor film 403 enables the transistor 440 to have stable electrical characteristics and high reliability.

Figure 3A:
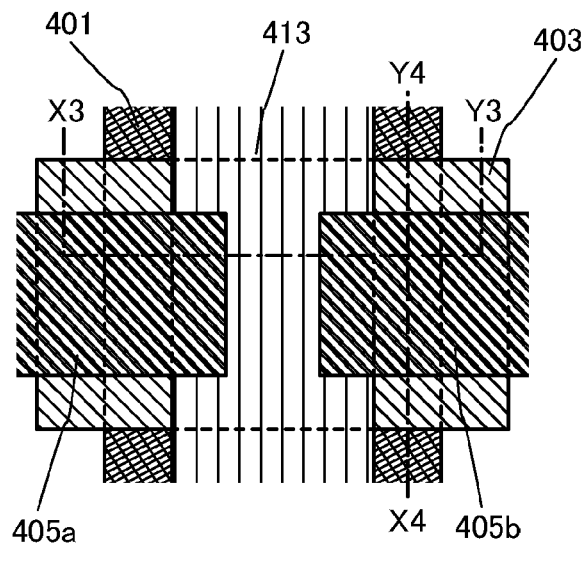
FIGS. 3A to 3C are a plan view and cross-sectional views illustrating one embodiment of a semiconductor device.
Figure 3C:
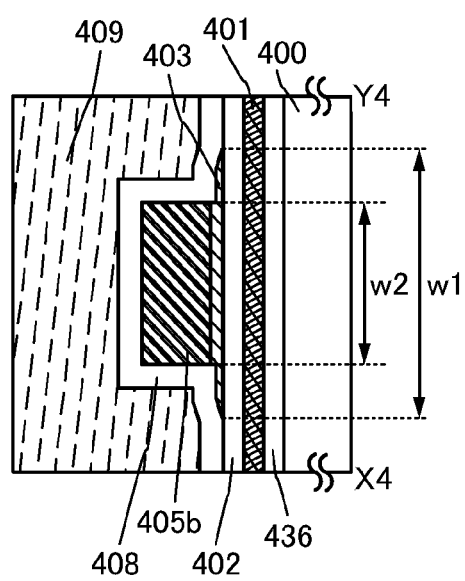
Figure 3B:
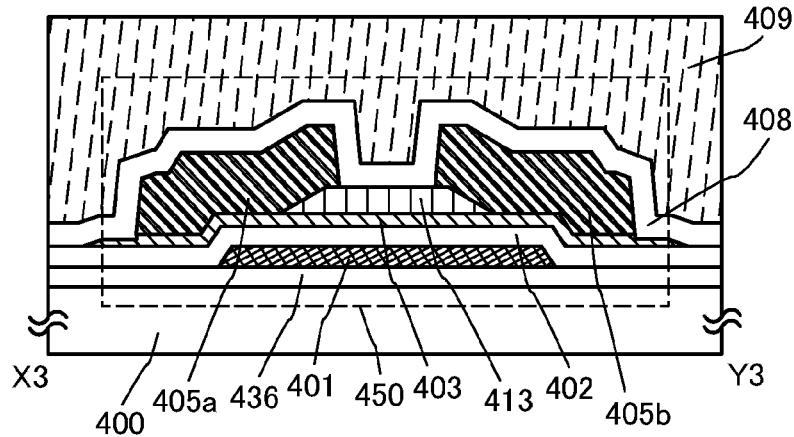

FIGS. 3A to 3C illustrate another structure of a transistor according to this embodiment. FIG. 3A is a plan view of a transistor 450. FIG. 3B is a cross-sectional view taken along line X3-Y3 in FIG. 3A. FIG. 3C is a cross-sectional view taken along line X4-Y4 in FIG. 3A.

The transistor 450 illustrated in FIGS. 3A to 3C is an example in which regions of the oxide semiconductor film 403 which are exposed from the source electrode layer 405a and the drain electrode layer 405b are etched by the impurity-removing treatment, so that the thicknesses of the regions are reduced. For example, when the IGZO film is processed using hydrofluoric acid which is diluted at a ratio of $1:10^3$ (0.05% hydrofluoric acid), the thickness is reduced by 1 nm to 3 nm per second; when the IGZO film is processed using hydrofluoric acid which is diluted at a ratio of $2:10^5$ (0.0025% diluted hydrofluoric acid), the thickness is reduced by approximately 0.1 nm per second.

In the oxide semiconductor film 403 included in the transistor 450, a region which overlaps with the insulating layer 413, the source electrode layer 405a, or the drain electrode layer 405b has a larger thickness than the regions which do not overlap with any of the insulating layer 413, the source electrode layer 405a, or the drain electrode layer 405b. The transistor 450 can have the same structure as the transistor 440 except for the thickness of the oxide semiconductor film 403.

In addition, the insulating layer 413 provided over the oxide semiconductor film 403 may also be processed by plasma treatment using an etching gas containing a halogen element. In this case, impurity-removing treatment is preferably performed after the etching treatment for forming the insulating layer 413. A method which is similar to the impurity-removing treatment performed after the formation of the source electrode layer 405a and the drain electrode layer 405b may be applied to the impurity-removing treatment.

In the case where first impurity-removing treatment is performed after the formation of the insulating layer 413 and second impurity-removing treatment is performed after the formation of the source electrode layer 405a and the drain electrode layer 405b, part of the oxide semiconductor film 403 may be etched depending on conditions of the impurity-removing treatment.

Figure 4A:
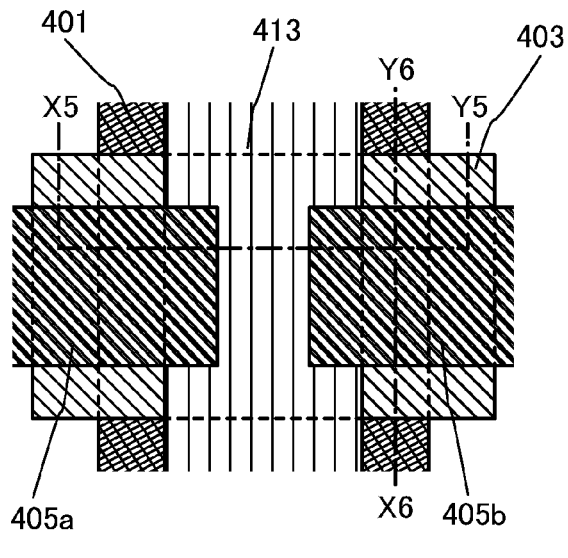
FIGS. 4A to 4C are a plan view and cross-sectional views illustrating one embodiment of a semiconductor device.
Figure 4C:
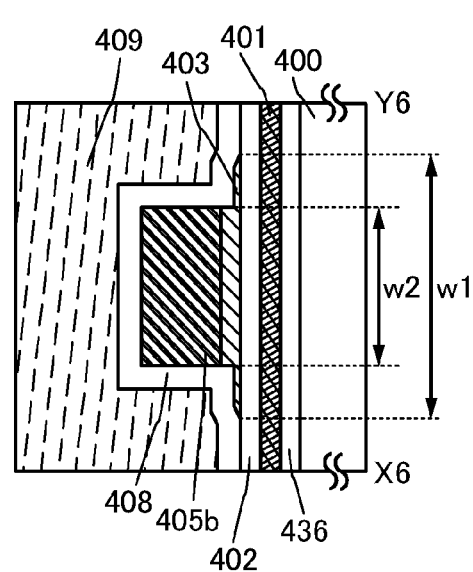
Figure 4B:
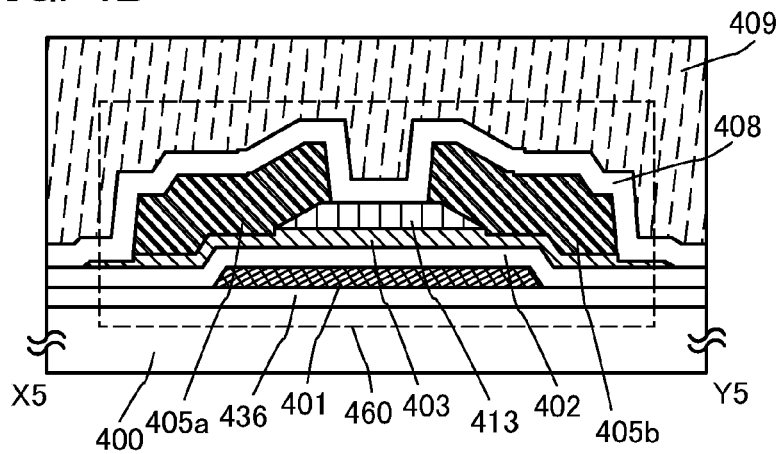

A transistor 460 illustrated in FIGS. 4A to 4C is an example in which the thickness of the oxide semiconductor film 403 is reduced by the first impurity-removing treatment and the second impurity-removing treatment. FIG. 4A is a plan view of the transistor 460. FIG. 4B is a cross-sectional view taken along line X5-Y5 in FIG. 4A. FIG. 4C is a cross-sectional view taken along line X6-Y6 in FIG. 4A.

The transistor 460 is an example in which the thicknesses of regions of the oxide semiconductor film 403 which do not overlap with the insulating layer 413 are reduced by the first impurity-removing treatment, and the thicknesses of regions of the oxide semiconductor film 403 which do not overlap with any of the insulating layer 413, the source electrode layer 405a, or the drain electrode layer 405b are reduced by the second impurity-removing treatment. Therefore, in the oxide semiconductor film 403 included in the transistor 460, regions overlapping with the source electrode layer 405a and the drain electrode layer 405b have a larger thickness than regions which do not overlap with any of the insulating layer 413, the source electrode layer 405a, or the drain electrode layer 405b, and the region overlapping with the insulating layer 413 has a larger thickness than the regions overlapping with the source electrode layer 405a and the drain electrode layer 405b.

Note that this embodiment is not limited thereto, and for example, the thickness of part of the oxide semiconductor film 403 (the regions which do not overlap with the insulating layer 413) is reduced by the first impurity-removing treatment, and the thickness of the oxide semiconductor film 403 is not reduced by the second impurity-removing treatment in some cases.

In addition, by the impurity-removing treatment performed after the formation of the source electrode layer 405a and the drain electrode layer 405b (or by the first impurity-removing treatment performed after the formation of the insulating layer 413 and the second impurity-removing treatment performed after the formation of the source electrode layer 405a and the drain electrode layer 405b), the regions of the oxide semiconductor film 403 which do not overlap with any of the insulating layer 413, the source electrode layer 405a, or the drain electrode layer 405b are removed in some cases.

Figure 5A:
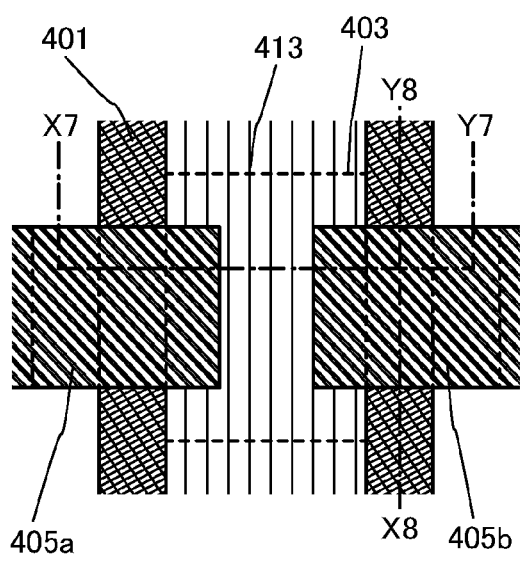
FIGS. 5A to 5C are a plan view and cross-sectional views illustrating one embodiment of a semiconductor device.
Figure 5C:
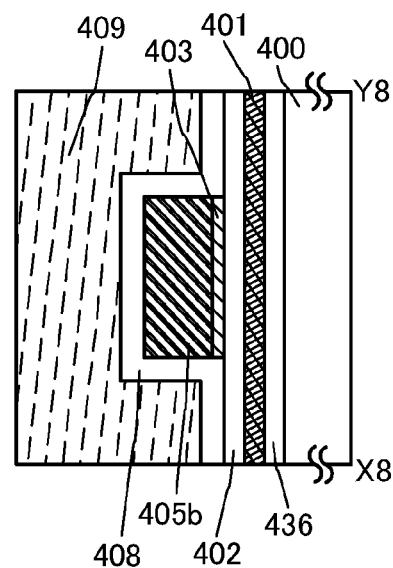
Figure 5B:
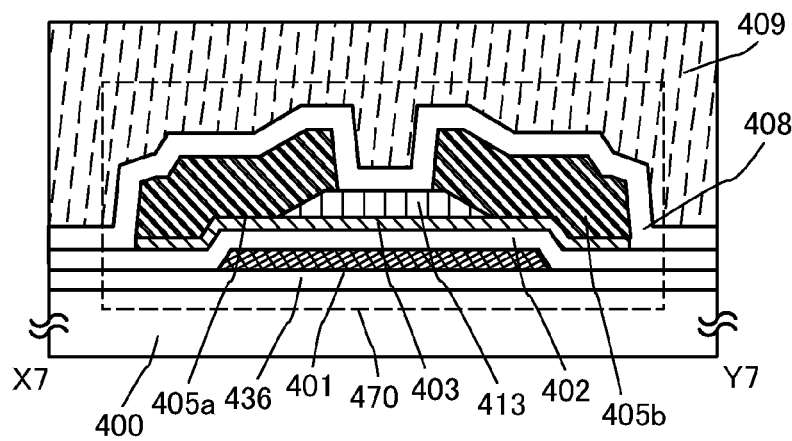

A transistor 470 illustrated in FIGS. 5A to 5C is an example in which regions of the oxide semiconductor film 403 which do not overlap with any of the insulating layer 413, the source electrode layer 405a, or the drain electrode layer 405b are removed. FIG. 5A is a plan view of the transistor 470. FIG. 5B is a cross-sectional view taken along line X7-Y7 in FIG. 5A. FIG. 5C is a cross-sectional view taken along line X8-Y8 in FIG. 5A.

The transistor 470 is an example in which the regions of the oxide semiconductor film 403 which do not overlap with any of the insulating layer 413, the source electrode layer 405a, or the drain electrode layer 405b are removed by impurity-removing treatment. Therefore, any region of the oxide semiconductor film 403 included in the transistor 470 overlaps with at least any one of the insulating layer 413, the source electrode layer 405a, and the drain electrode layer 405b.

When the semiconductor device is manufactured using the oxide semiconductor film 403 subjected to the impurity-removing treatment, the concentration of the elements (e.g., chlorine, fluorine, and boron) contained in the etching gas containing the halogen element in the surface of the oxide semiconductor film 403 (the periphery of an interface between the oxide semiconductor film 403 and each of the insulating layer 413, the source electrode layer 405a, and the drain electrode layer 405b) can be less than or equal to $5\times10^{18}$ atoms/cm$^3$ (preferably less than or equal to $1\times10^{18}$ atoms/cm$^3$).

Accordingly, a highly reliable semiconductor device including the transistor which is formed using the oxide semiconductor film 403 and has stable electric characteristics can be provided. In addition, the highly reliable semiconductor device can be manufactured with a high yield, which leads to high productivity.

The methods and structures described in this embodiment can be combined as appropriate with any of the methods and structures described in the other embodiments.

Embodiment 2

In this embodiment, one embodiment of a semiconductor device and one embodiment of a method for manufacturing the semiconductor device which are different from those in Embodiment 1 will be described using FIGS. 6A to 6C, FIGS. 7A to 7E, and FIGS. 8A to 8C. In this embodiment, a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 6A:
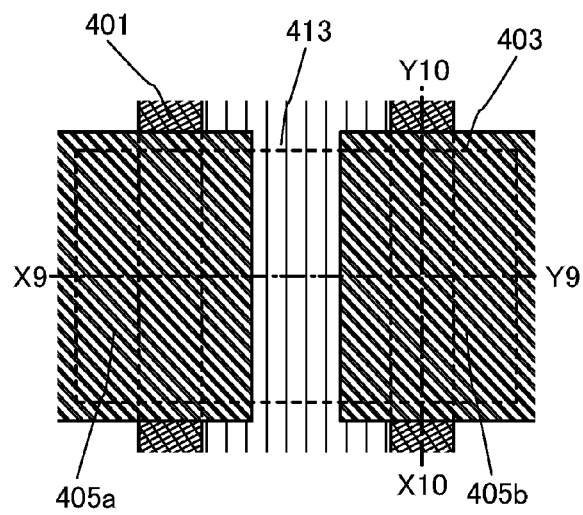
FIGS. 6A to 6C are a plan view and cross-sectional views illustrating one embodiment of a semiconductor device.
Figure 6C:
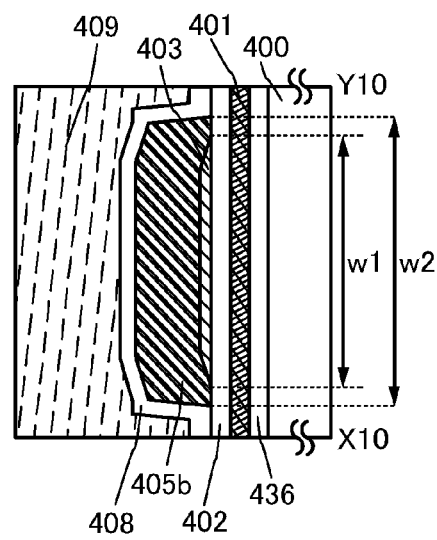
Figure 6B:
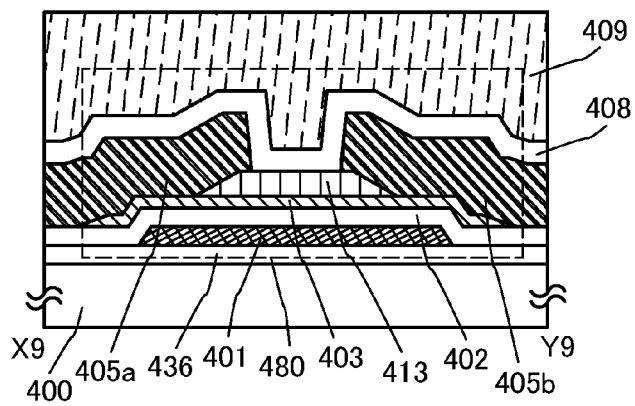

A transistor 480 illustrated in FIGS. 6A to 6C is an example of a transistor which is one of bottom-gate transistors and is also referred to as an inverted staggered transistor. FIG. 6A is a plan view of the transistor 480. FIG. 6B is a cross-sectional view taken along line X9-Y9 in FIG. 6A. FIG. 6C is a cross-sectional view taken along line X10-Y10 in FIG. 6A.

The transistor 480 illustrated in FIGS. 6A to 6C includes a gate electrode layer 401 which is provided over a substrate 400 having an insulating surface, a gate insulating film 402 which is provided over the gate electrode layer 401, an oxide semiconductor film 403 which has an island shape and is provided over the gate insulating film 402, an insulating layer 413 which is provided over the oxide semiconductor film 403 and overlaps with the gate electrode layer 401, and a source electrode layer 405a and a drain electrode layer 405b which are in contact with the oxide semiconductor film 403 and the insulating layer 413. In addition, the transistor 480 may further include, as its components, a base insulating film 436 which is provided over the substrate 400, and an interlayer insulating film 408 and a planarization insulating film 409 which cover the transistor 480.

In the transistor 480, a length w2 of each of the source electrode layer 405a and the drain electrode layer 405b in the channel width direction is larger than a length w1 of the oxide semiconductor film 403 in the channel width direction, and edge portions of the oxide semiconductor film 403 in the channel width direction are covered with the source electrode layer 405a and the drain electrode layer 405b. In other words, regions of the oxide semiconductor film 403 which do not overlap with the insulating layer 413 are covered with the source electrode layer 405a and the drain electrode layer 405b.

The transistor 480 can have the same structure as the transistor 440 except that the length w2 of each of the source electrode layer 405a and the drain electrode layer 405b in the channel width direction is larger than the length w1 of the oxide semiconductor film 403 in the channel width direction.

Here, in the manufacturing process of the transistor 480, the surface of the oxide semiconductor film 403 is subjected to impurity-removing treatment; therefore, elements contained in an etching gas containing a halogen element which is used for forming the insulating layer 413 can be prevented from remaining as impurities. Accordingly, the concentration of the halogen element and the like in the surface of the oxide semiconductor film 403 (the periphery of an interface between the oxide semiconductor film 403 and each of the source electrode layer 405a and the drain electrode layer 405b) can be lower than or equal to $5\times10^{18}$ atoms/cm$^3$ (preferably lower than or equal to $1\times10^{18}$ atoms/cm$^3$). Specifically, the chlorine concentration thereof can be lower than or equal to $5\times10^{18}$ atoms/cm$^3$ (preferably lower than or equal to $1\times10^{18}$ atoms/cm$^3$). In addition, the fluorine concentration thereof can also be lower than or equal to $5\times10^{18}$ atoms/cm$^3$ (preferably lower than or equal to $1\times10^{18}$ atoms/cm$^3$), and the boron concentration thereof can also be lower than or equal to $5\times10^{18}$ atoms/cm$^3$ (preferably lower than or equal to $1\times10^{18}$ atoms/cm$^3$). In this manner, since impurities which can cause the oxide semiconductor film to have lower resistance are reduced, the reliability of the semiconductor device including the oxide semiconductor film can be increased.

A method for manufacturing such a transistor 480 is described using FIGS. 7A to 7E.

Figure 7A:
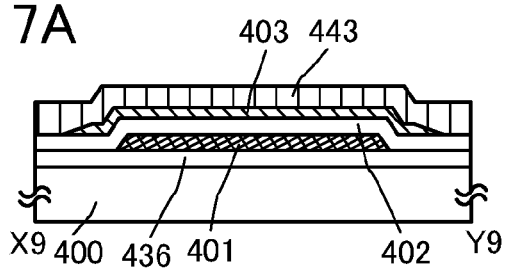
FIGS. 7A to 7E are cross-sectional views illustrating one embodiment of a method for manufacturing a semiconductor device.

First, the base insulating film 436, the gate electrode layer 401, the gate insulating film 402, and the oxide semiconductor film 403 are formed over the substrate 400, and an insulating film 443 is deposited to cover the oxide semiconductor film 403 (see FIG. 7A). Here, materials and formation methods and the like of the substrate 400, the base insulating film 436, the gate electrode layer 401, the gate insulating film 402, and the oxide semiconductor film 403 may be similar to those of the transistor 440 described in Embodiment 1. In addition, the material and the deposition method of the insulating layer 413 of the transistor 440 can be referred to for the material and the formation method and the like of the insulating film 443.

Figure 7B:
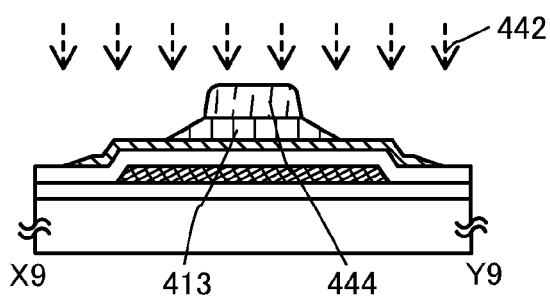

Next, the insulating film 443 is processed by plasma treatment using an etching gas 442 containing a halogen element, so that the insulating layer 413 functioning as a channel protective film is formed in a position overlapping with the gate electrode layer 401 (see FIG. 7B). The etching treatment is performed in such a manner that a resist mask 444 is formed over the insulating film 443 by a photolithography process and selective etching is performed to form the insulating layer 413, and then the resist mask 444 is removed. As a result, the insulating layer 413 is formed to overlap with the gate electrode layer 401 and be over and in contact with a channel formation region of the oxide semiconductor film 403.

Here, a cross-sectional shape of the insulating layer 413 is a trapezoid or a triangle, and a taper angle at a bottom edge portion of the cross-sectional shape is less than or equal to 60°, preferably less than or equal to 45°, further preferably less than or equal to 30°.

As an etching method, dry etching is preferably used, and a parallel-plate RIE method or an ICP etching method can be used, for example. In order to etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

As the etching gas 442 containing the halogen element, a gas containing fluorine, a gas containing chlorine, or the like can be used. Examples of the gas containing fluorine include carbon tetrafluoride ($CF_4$), sulfur hexafluoride ($SF_6$), nitrogen trifluoride ($NF_3$), trifluoromethane ($CHF_3$), octafluorocyclobutane ($C_4F_8$), and the like. In the case where an insulating film containing silicon oxide or the like is used as the insulating film 443, etching can be easily performed using such a gas containing fluorine. Further, examples of the gas containing chlorine include chlorine ($Cl_2$), boron trichloride ($BCl_3$), silicon tetrachloride ($SiCl_4$), or carbon tetrachloride ($CCl_4$), and the like. In the case where an insulating film containing aluminum oxide or the like is used as the insulating film 443, the etching can be easily performed using such a gas containing chlorine.

Note that in this embodiment, the insulating film 443 formed using silicon oxide is selectively etched using $CF_4$ so that the taper angle of the bottom edge portion of the insulating layer 413 is approximately 30°.

In this manner, the etching gas 442 containing the halogen element is used in the etching treatment for forming the insulating layer 413 illustrated in FIG. 7B. However, when the oxide semiconductor film 403 is exposed to the etching gas 442 containing the halogen element, oxygen in the oxide semiconductor film 403 is extracted by the etching gas 442 containing the halogen element, and thus oxygen vacancies might be formed in the surface of the oxide semiconductor film 403 (the periphery of the interface between the oxide semiconductor film 403 and each of the source electrode layer 405a and the drain electrode layer 405b). When oxygen vacancies are generated in the oxide semiconductor film 403, the resistance of the oxide semiconductor film 403 on the back channel side might be reduced (the oxide semiconductor film 403 on the back channel side might have n-type conductivity) and a parasitic channel might be formed.

For example, in the case where an oxide semiconductor material containing indium is used for the oxide semiconductor film 403 and an etching gas containing boron trichloride ($BCl_3$) is used for processing the insulating layer 413 which is provided in contact with the oxide semiconductor film 403, an In—O—In bond in the oxide semiconductor film and Cl contained in the etching gas sometimes react with each other, so that a film including an In—Cl bond and an In element from which oxygen is detached may be formed. Since the In element from which oxygen is detached has a dangling bond, an oxygen vacancy exists in the portion of the oxide semiconductor film 403, from which oxygen is detached.

Further, an element (e.g., boron) that is not halogen, which may be contained in the etching gas containing a halogen element, can cause the backchannel of the oxide semiconductor film 403 to have lower resistance (n-type conductivity).

Figure 7C:
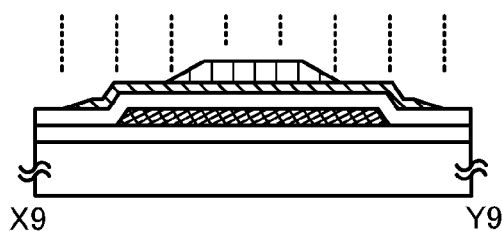

Therefore, impurity-removing treatment is performed after the formation of the insulating layer 413 in order to prevent elements contained in the etching gas containing the halogen element from remaining as impurities in the surface of the insulating layer 413 and the surface of the oxide semiconductor film 403 (the periphery of the interface between the oxide semiconductor film 403 and each of the source electrode layer 405a and the drain electrode layer 405b) (see FIG. 7C). Here, examples of impurities include chlorine, fluorine, and boron.

The impurity-removing treatment can be performed by plasma treatment or treatment with a solution. As the plasma treatment, oxygen plasma treatment or dinitrogen monoxide plasma treatment is preferably used. In addition, a rare gas (typically argon) may be used in the plasma treatment. In addition, cleaning treatment with a diluted hydrofluoric acid solution is preferably used as the treatment with the solution. For example, in the case where a diluted hydrofluoric acid solution is used, the dilution ratio of the diluted hydrofluoric acid is approximately $1:10^2$ to $1:10^5$, preferably approximately $1:10^3$ to $1:10^5$. Alternatively, as the treatment with a solution, treatment with an alkaline solution such as a TMAH solution may be employed. Further, the cleaning treatment may be performed using water instead of a solution.

In this manner, by performing the impurity-removing treatment, the concentration of the elements (e.g., chlorine, fluorine, and boron) contained in the etching gas containing the halogen element in the surface of the oxide semiconductor film 403 (the periphery of the interface between the oxide semiconductor film 403 and each of the source electrode layer 405a and the drain electrode layer 405b) can be lower than or equal to $5 \times 10^{18}$ atoms/cm$^3$ (preferably lower than or equal to $1 \times 10^{18}$ atoms/cm$^3$). In this manner, since the impurities which can cause the oxide semiconductor film to have lower resistance can be removed, the reliability of the semiconductor device including the oxide semiconductor film can be increased.

Note that heat treatment may be performed after the insulating layer 413 is formed. In this embodiment, the heat treatment is performed at 300° C. for 1 hour in a nitrogen atmosphere.

Figure 7D:
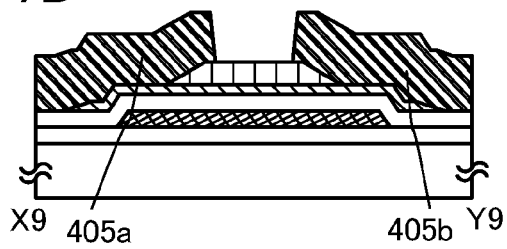

Next, a conductive film is deposited over the gate electrode layer 401, the gate insulating film 402, the oxide semiconductor film 403, and the insulating layer 413, and the conductive film is selectively etched, so that the source electrode layer 405a and the drain electrode layer 405b (including a wiring formed using the same layer) are formed (see FIG. 7D). The source electrode layer 405a and the drain electrode layer 405b are formed using photolithography, and the resist mask is removed after the formation. As a result, an edge portion of the drain electrode layer 405b is located over a top surface or a side surface of the insulating layer 413, and an edge portion of the source electrode layer 405a is located over the top surface or a side surface of the insulating layer 413.

Here, the source electrode layer 405a and the drain electrode layer 405b are formed so as to cover regions of the oxide semiconductor film 403 which do not overlap with the insulating layer 413. As a result, as illustrated in FIG. 6C, the length w2 of each of the source electrode layer 405a and the drain electrode layer 405b in the channel width direction is larger than the length w1 of the oxide semiconductor film 403 in the channel width direction, and the edge portions of the oxide semiconductor film 403 in the channel width direction are covered with the source electrode layer 405a and the drain electrode layer 405b.

Here, the material formation method, and the like of the source electrode layer 405a and the drain electrode layer 405b may be similar to those of the transistor 440 described in Embodiment 1.

In this embodiment, as the conductive film, a stack of a 100-nm-thick titanium film, a 400-nm-thick aluminum film, and a 100-nm-thick titanium film, which is formed by a sputtering method, is used.

In this embodiment, the etching of the conductive film for forming the source electrode layer 405a and the drain electrode layer 405b is performed in such a manner that the stack of the titanium film, the aluminum film, and the titanium film is etched by dry etching using $Cl_2$ and $BCl_3$ as an etching gas.

In this manner, the semiconductor device is exposed to the etching gas containing the halogen element. However, in this embodiment, the etching of the conductive film is performed in the state where the oxide semiconductor film is covered with the insulating layer 413, the source electrode layer 405a, and the drain electrode layer 405b; therefore, the oxide semiconductor film can be prevented from being directly exposed to the etching gas containing the halogen element.

Figure 7E:
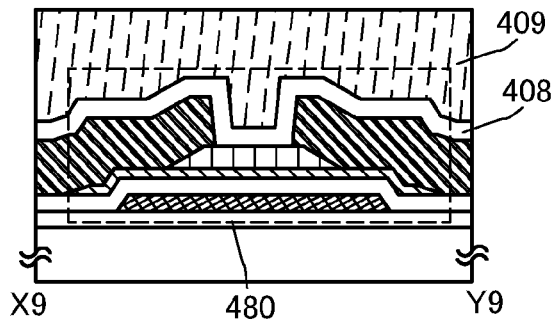

Through the above-described process, the transistor 480 described in this embodiment can be manufactured (see FIG. 7E).

In addition, as illustrated in FIG. 7E, the interlayer insulating film 408 and the planarization insulating film 409 may be formed over the transistor 480. Here, the materials and formation methods of the interlayer insulating film 408 and the planarization insulating film 409 may be similar to those of the transistor 440 described in Embodiment 1.

Note that although the transistor 480 is described as an example in which the thickness of the whole oxide semiconductor film 403 is substantially uniform, this embodiment is not limited thereto. A transistor 490 which has a different structure from the transistor 480 is described using FIGS. 8A to 8C.

Figure 8A:
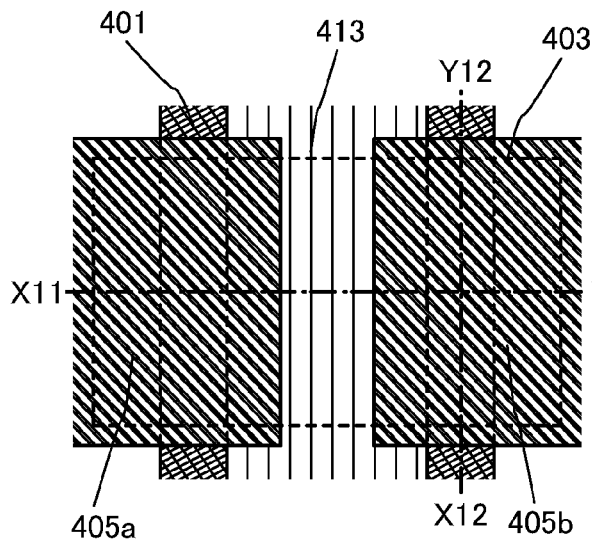
FIGS. 8A to 8C are a plan view and cross-sectional views illustrating one embodiment of a semiconductor device.
Figure 8C:
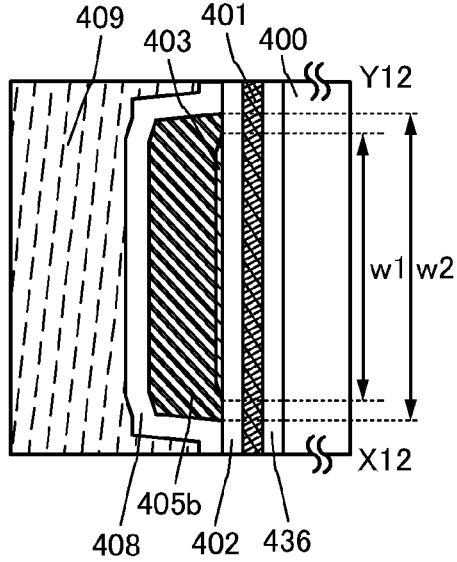
Figure 8B:
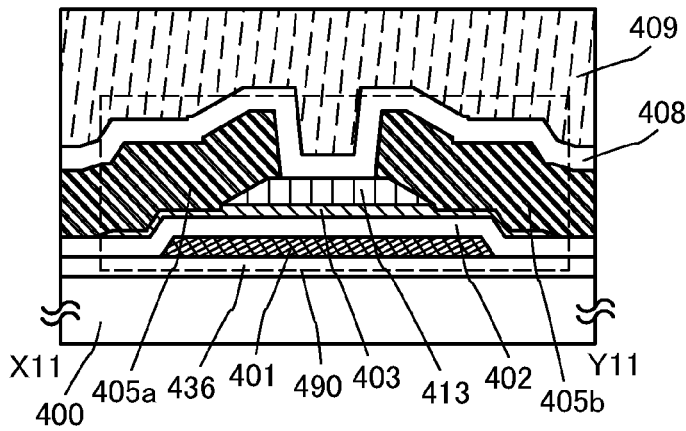

The transistor 490 illustrated in FIGS. 8A to 8C is an example of a transistor which is one of bottom-gate transistors and is also referred to as an inverted staggered transistor. FIG. 8A is a plan view of the transistor 490. FIG. 8B is a cross-sectional view taken along line X11-Y11 in FIG. 8A. FIG. 8C is a cross-sectional view taken along line X12-Y12 in FIG. 8A.

The transistor 490 illustrated in FIGS. 8A to 8C is an example in which regions of the oxide semiconductor film 403 which are exposed from the insulating layer 413 are etched by the impurity-removing treatment, so that the thicknesses of the regions are reduced.

The transistor 490 is different from the transistor 480 in that a region of the oxide semiconductor film 403 which overlaps and is in contact with the insulating layer 413 has a larger thickness than regions of the oxide semiconductor film 403 which overlap and are in contact with the source electrode layer 405a and the drain electrode layer 405b. Note that the other components of the transistor 490 are similar to those of the transistor 480; therefore, details of the components of the transistor 480 are referred to for those of the transistor 490.

The transistor 490 can be manufactured in a manner similar to that of the transistor 480, and as illustrated in FIG. 7C, the impurity-removing treatment is performed to prevent elements contained in the etching gas containing halogen from remaining as impurities in the surface of the insulating layer 413 and the surface of the oxide semiconductor film 403 (the periphery of the interface between the oxide semiconductor film 403 and each of the source electrode layer 405a or the drain electrode layer 405b). The impurity-removing treatment can be performed by plasma treatment or treatment with a solution, in a manner similar to the process illustrated in FIG. 7C. As the plasma treatment, oxygen plasma treatment or dinitrogen monoxide plasma treatment is preferably used. In addition, a rare gas (typically argon) may be used in the plasma treatment. In addition, cleaning treatment with a diluted hydrofluoric acid solution is preferably used as the treatment with the solution. For example, in the case where a diluted hydrofluoric acid solution is used, the dilution ratio of the hydrofluoric acid is approximately $1:10^2$ to $1:10^5$, preferably approximately $1:10^3$ to $1:10^5$. Alternatively, as the treatment with a solution, treatment with an alkaline solution such as a TMAH solution may be employed. Further, the cleaning treatment may be performed using water instead of a solution.

In this manner, as illustrated in FIG. 7C, plasma treatment or treatment with a solution may be performed on the surface of the oxide semiconductor film 403 which is exposed to the etching gas containing the halogen element, as the impurity-removing treatment of the surface of the oxide semiconductor film 403. In other words, the elements which are contained in the etching gas containing the halogen element and remain on the surface of the oxide semiconductor film 403 as impurities may be removed together with the part of the oxide semiconductor film 403. As a result, the thickness of the region of the oxide semiconductor film 403 which overlaps with the insulating layer 413 becomes larger than that of the region of the oxide semiconductor film 403 which overlaps with the source electrode layer 405a or the drain electrode layer 405b. For example, when the IGZO film is processed using hydrofluoric acid which is diluted at a ratio of $1:10^3$ (0.05% hydrofluoric acid), the thickness is reduced by 1 nm to 3 nm per second; when the IGZO film is processed using hydrofluoric acid which is diluted at a ratio of $2:10^5$ (0.0025% diluted hydrofluoric acid), the thickness is reduced by approximately 0.1 nm per second.

As described in this embodiment, when a semiconductor device including an oxide semiconductor film is manufactured employing impurity-removing treatment, the concentration of elements (e.g., chlorine, fluorine, and boron) contained in an etching gas containing a halogen element in a surface of the oxide semiconductor film (the periphery of an interface between the oxide semiconductor film and each of a source electrode layer and a drain electrode layer) can be lower than or equal to $5 \times 10^{18}$ atoms/cm$^3$ (preferably lower than or equal to $1 \times 10^{18}$ atoms/cm$^3$).

Accordingly, a highly reliable semiconductor device including the transistor which is formed using the oxide semiconductor film and has stable electric characteristics can be provided. Further, a highly reliable semiconductor device is manufactured with a high yield, which leads to high productivity.

The methods and structures described in this embodiment can be combined as appropriate with any of the methods and structures described in the other embodiments.

Embodiment 3

A semiconductor device having a display function (also referred to as a display device) can be manufactured using the transistor described in Embodiment 1 or 2. Some or all of driver circuits including transistors can be formed over a substrate where a pixel portion is formed, whereby a system-on-panel can be obtained.

Figure 9A:
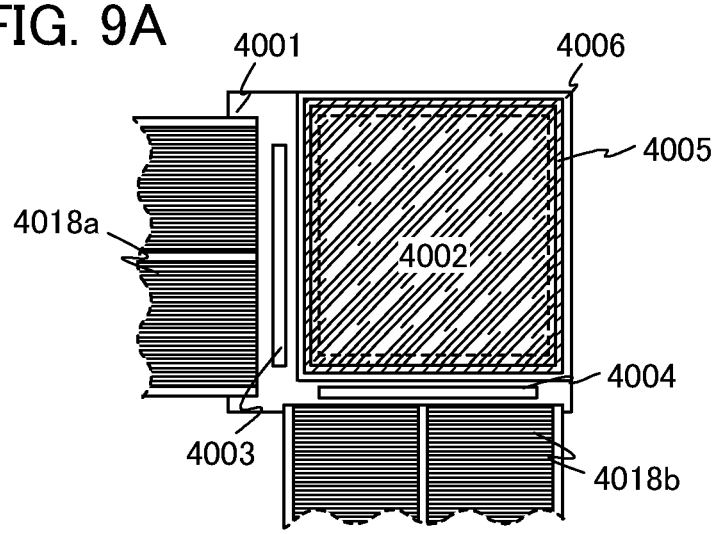
FIGS. 9A to 9C are plan views each illustrating one embodiment of a semiconductor device.

In FIG. 9A, a sealant 4005 is provided so as to surround a pixel portion 4002 provided over a first substrate 4001, and the pixel portion 4002 is sealed by using a second substrate 4006. In FIG. 9A, a signal line driver circuit 4003 and a scan line driver circuit 4004 which are each formed using a single crystal semiconductor film or a polycrystalline semiconductor film over a substrate separately prepared are mounted in a region that is different from the region surrounded by the sealant 4005 over the first substrate 4001. Various signals and potential are supplied to the signal line driver circuit 4003 and the scan line driver circuit 4004 each of which is separately formed, or the pixel portion 4002 from flexible printed circuits (FPCs) 4018a and 4018b.

Figure 9B:
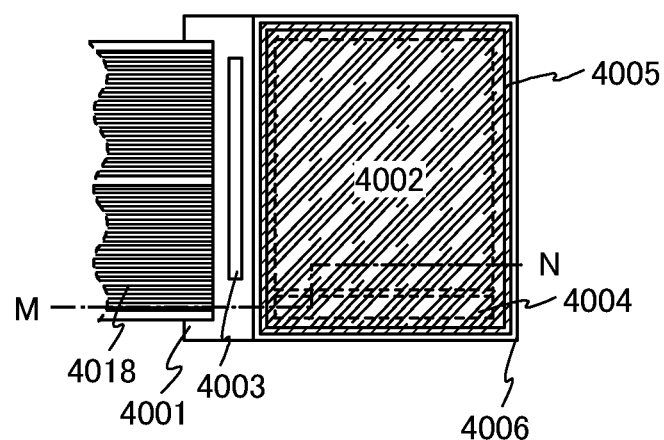
Figure 9C:
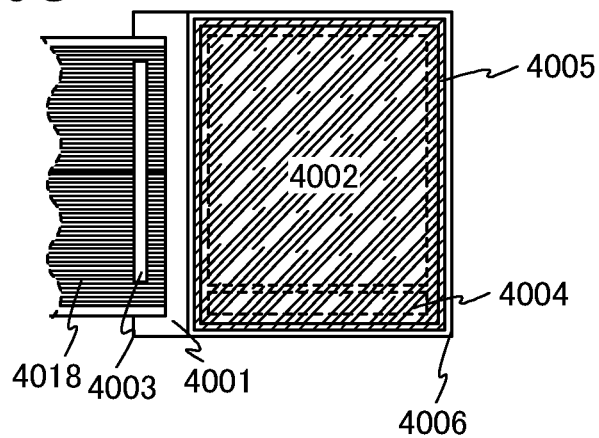

In FIGS. 9B and 9C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 9B and 9C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 9B and 9C, various signals and potentials are supplied to the signal line driver circuit 4003 which is separately formed, and the scan line driver circuit 4004 or the pixel portion 4002 from flexible printed circuits (FPCs) 4018.

Although FIGS. 9B and 9C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 9A illustrates an example in which the signal line driver circuit 4003 and the scan line driver circuit 4004 are mounted by a COG method. FIG. 9B illustrates an example in which the signal line driver circuit 4003 is mounted by a COG method. FIG. 9C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display unit, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 1 or 2 can be applied thereto.

As the display element provided in the display device, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as electronic ink, can be used.

Embodiments of the semiconductor device are described with reference to FIGS. 9A to 9C, FIGS. 10A and 10B, and FIGS. 11A and 11B. FIGS. 11A and 11B are each a cross-sectional view taken along line M-N in FIG. 9B.

As shown in FIGS. 9A to 9C and FIGS. 11A and 11B, the semiconductor device includes a connection terminal electrode 4015 and a terminal electrode 4016, and the connection terminal electrode 4015 and the terminal electrode 4016 are electrically connected to terminals included in the FPCs 4018 and 4018b through an anisotropic conductive film 4019.

The connection terminal electrode 4015 is formed using the same conductive film as a first electrode layer 4030, and the terminal electrode 4016 is formed using the same conductive film as gate electrode layers of transistors 4010 and 4011.

The pixel portion 4002 and the scan line driver circuit 4004 provided over the first substrate 4001 include a plurality of transistors. In FIGS. 11A and 11B, the transistor 4010 included in the pixel portion 4002 and the transistor 4011 included in the scan line driver circuit 4004 are illustrated as an example. An insulating film 4020 is provided over the transistors 4010 and 4011 in FIG. 11A, and an insulating film 4021 is further provided in FIG. 11B.

The transistor described in Embodiment 1 or 2 can be applied to the transistor 4010 and the transistor 4011. In this embodiment, an example in which a transistor having a structure similar to that of the transistor 440 described in Embodiment 1 is used is described. The transistors 4010 and 4011 are inverted staggered transistors with a bottom-gate structure, in each of which an insulating layer functioning as a channel protective film is provided over an oxide semiconductor film.

Each of the transistors 4010 and 4011 has a structure similar to that of the transistor 440 described in Embodiment 1, and is obtained by a manufacturing method similar to that of the transistor 440. In the manufacturing method, a source electrode layer and a drain electrode layer are formed through an etching step using halogen plasma, and then a step in which impurities (specifically elements contained in the etching gas) are removed from a surface of an oxide semiconductor film and the periphery thereof is performed. In addition, the impurity-removing treatment may be performed after an insulating film functioning as a channel protective film is formed through an etching step using halogen plasma. For the impurity-removing treatment, for example, diluted hydrofluoric acid treatment or plasma treatment using oxygen or dinitrogen monoxide can be favorably employed.

Since the surface of the oxide semiconductor film and the periphery thereof can be prevented from being contaminated by impurities contained in the etching gas, the concentration of the elements (e.g., chlorine and boron) contained in the etching gas containing the halogen element can be lower than or equal to $5 \times 10^{18}$ atoms/cm$^3$ (preferably lower than or equal to $1 \times 10^{18}$ atoms/cm$^3$) in the surface of the oxide semiconductor film of each of the transistors 4010 and 4011.

Accordingly, highly reliable semiconductor devices can be provided as the semiconductor devices of this embodiment in FIGS. 9A to 9C and FIGS. 11A and 11B, which include the transistors 4010 and 4011 which are formed using an oxide semiconductor film and have stable electric characteristics.

Further, such a highly reliable semiconductor device can be manufactured with a high yield, which leads to high productivity.

Further, a conductive layer may be provided in a region overlapping with a channel formation region of the oxide semiconductor film in the transistor 4011 for the driver circuit. By providing the conductive layer in the region overlapping with the channel formation region of the oxide semiconductor film, the amount of change in the threshold voltage of the transistor 4011 by a bias-temperature stress test (BT test) can be further reduced. The conductive layer may have the same potential as or a potential different from that of a gate electrode layer of the transistor 4011, and can function as a second gate electrode layer. The potential of the conductive layer may be GND, 0V, or in a floating state.

The conductive layer also functions of blocking an external electric field, that is, preventing an external electric field (particularly, to prevent static electricity) from effecting the inside (a circuit portion including a transistor). A blocking function of the conductive layer can prevent the variation in electrical characteristics of the transistor due to the effect of external electric field such as static electricity.

The transistor 4010 included in the pixel portion 4002 is electrically connected to a display element to form a display panel. There is no particular limitation on the kind of the display element as long as display can be performed, and various kinds of display elements can be employed.

FIG. 11A illustrates an example of a liquid crystal display device using a liquid crystal element as a display element. In FIG. 11A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is provided therebetween. The second electrode layer 4031 is provided on the second substrate 4006 side, and the first electrode layer 4030 and the second electrode layer 4031 are stacked, with the liquid crystal layer 4008 provided therebetween.

A spacer 4035 is a columnar spacer which is obtained by selective etching of an insulating film and is provided in order to control the thickness (a cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor film has a possibility that the electric characteristics of the transistor may vary significantly by the influence of static electricity and deviate from the designed range. Therefore, it is more effective to use a liquid crystal composition exhibiting a blue phase for the liquid crystal display device including the transistor formed using an oxide semiconductor film.

The specific resistivity of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using the transistor including an oxide semiconductor film disclosed in this specification, a capacitance that is ⅓ or less, preferably ⅕ or less of liquid crystal capacitance of each pixel is enough as the magnitude of the storage capacitor.

In the transistor using an oxide semiconductor film disclosed in this specification, the current in an off state (off-state current) can be controlled to be low. Accordingly, an electrical signal such as an image signal can be held for a longer period in the pixel, and a writing interval can be set longer in an on state. Accordingly, the frequency of refresh operation can be reduced, which leads to an effect of suppressing power consumption.

The transistor including an oxide semiconductor film disclosed in this specification can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as the light-emitting element is described.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of the pair of electrodes has a light-transmitting property. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figure 10A:
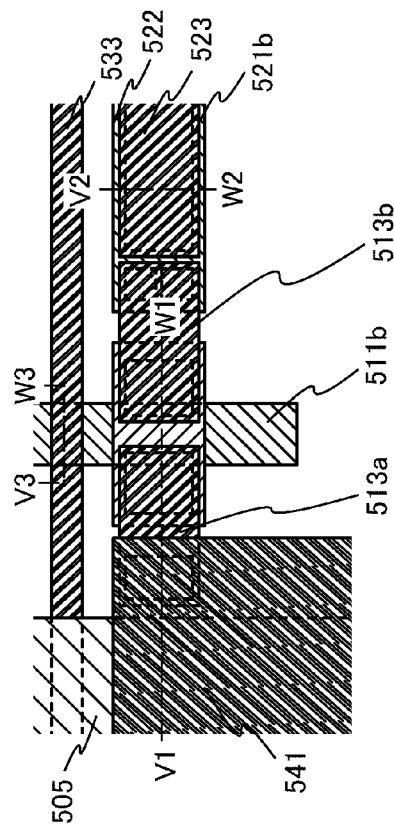
FIGS. 10A and 10B are a plan view and a cross-sectional view illustrating one embodiment of a semiconductor device.
Figure 10B:
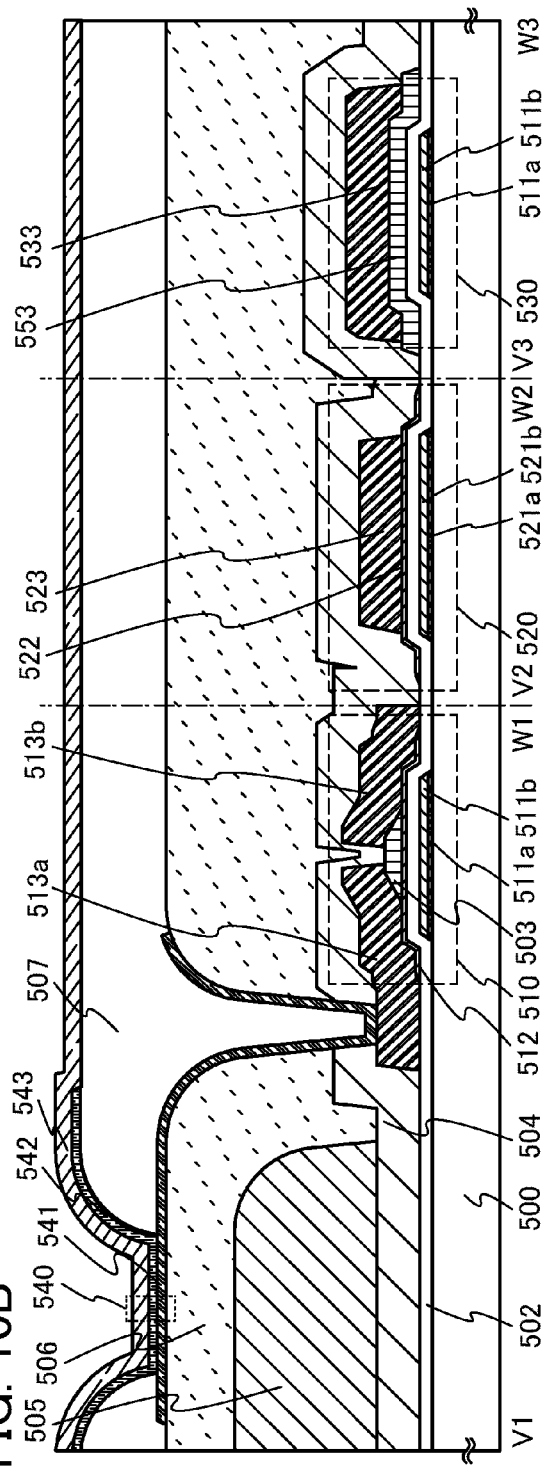

Examples of a light-emitting device in which a light-emitting element is used as a display element are illustrated in FIGS. 10A and 10B and FIG. 11B.

FIG. 10A is a plan view of a light-emitting device and FIG. 10B is a cross-sectional view taken along dashed-dotted lines V1-W1, V2-W2, and V3-W3 in FIG. 10A. Note that, an electroluminescent layer 542 and a second electrode layer 543 are not illustrated in the plan view in FIG. 10A.

The light-emitting device illustrated in FIGS. 10A and 10B includes, over a substrate 500, a transistor 510, a capacitor 520, and a wiring layer intersection 530. The transistor 510 is electrically connected to a light-emitting element 540. Note that FIGS. 10A and 10B illustrate a bottom-emission light-emitting device in which light from the light-emitting element 540 is extracted through the substrate 500.

The transistor described in Embodiment 1 or 2 can be applied to the transistor 510. In this embodiment, an example in which a transistor having a structure similar to that of the transistor 440 described in Embodiment 1 is used is described. The transistor 510 is an inverted staggered transistor with a bottom-gate structure, in which an insulating layer functioning as a channel protective film is provided over an oxide semiconductor film.

The transistor 510 includes gate electrode layers 511a and 511b, a gate insulating film 502, an oxide semiconductor film 512, an insulating layer 503, and conductive layers 513a and 513b functioning as a source electrode layer and a drain electrode layer.

The transistor 510 has a structure similar to that of the transistor 440 described in Embodiment 1, and is obtained by a manufacturing method similar to that of the transistor 440. In the manufacturing method, the conductive layers 513a and 513b functioning as the source electrode layer and the drain electrode layer are formed through an etching step using halogen plasma, and then a step in which impurities contained in the etching gas are removed from a surface of the oxide semiconductor film and the periphery thereof is performed. The impurity-removing treatment may be performed after an insulating layer functioning as a channel protective film is formed through an etching step using halogen plasma. For the impurity removal step, for example, diluted hydrofluoric acid treatment or plasma treatment using oxygen or dinitrogen monoxide can be favorably employed.

Since the surface of the oxide semiconductor film and the periphery thereof can be prevented from being contaminated by impurities contained in the etching gas, the concentration of elements (e.g., chlorine and boron) contained in the etching gas containing a halogen element can be lower than or equal to $5 \times 10^{18}$ atoms/cm$^3$ (preferably lower than or equal to $1 \times 10^{18}$ atoms/cm$^3$) in the surface of the oxide semiconductor film of the transistor 510.

Accordingly, a highly reliable semiconductor device can be provided as the semiconductor device of this embodiment in FIGS. 10A and 10B, which includes the transistor 510 which is formed using the oxide semiconductor film 512 and has stable electric characteristics. Further, such a highly reliable semiconductor device can be manufactured with a high yield, which leads to high productivity.

The capacitor 520 includes conductive layers 521a and 521b, the gate insulating film 502, an oxide semiconductor film 522, and a conductive layer 523. The gate insulating film 502 and the oxide semiconductor film 522 are provided between the conductive layer 523 and the conductive layers 521a and 521b, so that the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating film 502 and an insulating layer 553 which is formed through the same step as the insulating layer 503 provided therebetween. In the structure described in this embodiment, not only the gate insulating film 502 but also the insulating layer 553 can be provided between the conductive layer 533 and the gate electrode layers 511a and 511b at the wiring layer intersection 530; thus, parasitic capacitance generated between the conductive layer 533 and the gate electrode layers 511a and 511b can be reduced.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer has a stacked-layer structure of a titanium film and a copper thin film.

A 25-nm-thick IGZO film is used as the oxide semiconductor films 512 and 522.

An interlayer insulating film 504 is formed over the transistor 510, the capacitor 520, and the wiring layer intersection 530. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma CVD method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are all colors except achromatic colors such as black, gray, and white. The color filter layer is formed using a material which transmits only light of the chromatic colors. As chromatic color, red, green, blue, or the like can be used. Further, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

In the light-emitting device illustrated in FIG. 11B, a light-emitting element 4513 which is a display element is electrically connected to the transistor 4010 provided in the pixel portion 4002. A structure of the light-emitting element 4513 is not limited to the illustrated stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

Partitions 4510 and 507 can be formed using an organic insulating material or an inorganic insulating material. It is particularly preferable that the partitions 4510 and 507 are formed using a photosensitive resin material to have an opening over the first electrode layers 4030 and 541 so that a sidewall of the opening is formed as a tilted surface with continuous curvature.

The electroluminescent layers 4511 and 542 consist of either a single layer or a plurality of layers stacked.

In order to prevent the entry of oxygen, hydrogen, moisture, carbon dioxide, and the like into the light-emitting elements 4513 and 540, a protective film may be formed over the second electrode layers 4031 and 543 and the partitions 4510 and 507. As the protective film, a silicon nitride film, a silicon nitride oxide film, a DLC film, or the like can be formed.

Further, a layer containing an organic compound may be deposited by a deposition method to cover the light-emitting element 4513 and 540 so that oxygen, hydrogen, moisture, carbon dioxide, and the like do not enter the light-emitting elements 4513 and 540.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used, as well as an inert gas such as nitrogen or argon. PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these materials.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

Note that in FIGS. 9A to 9C to FIGS. 11A and 11B, a flexible substrate as well as a glass substrate can be used as any of the first substrate 4001, the substrate 500, and the second substrate 4006. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is provided between PVF films or polyester films can be used.

In this embodiment, an aluminum oxide film is used as the insulating film 4020. The insulating film 4020 can be formed by a sputtering method or a plasma CVD method.

The aluminum oxide film provided as the insulating film 4020 over the oxide semiconductor film has a high shielding effect (blocking effect) of preventing penetration of both oxygen and impurities such as hydrogen and moisture.

Therefore, during the manufacturing process and after the manufacture, the aluminum oxide film functions as a protective film for preventing the entry of an impurity such as hydrogen or moisture, which can cause a change, into the oxide semiconductor film and release of oxygen, which is a main component material of the oxide semiconductor, from the oxide semiconductor film.

The insulating films 4021 and 506 each serving as a planarization insulating film can be formed using an organic material having heat resistance, such as an acrylic resin, polyimide, benzocyclobutene-based resin, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating film may be formed by stacking a plurality of insulating films formed of these materials.

The method for forming the insulating films 4021 and 506 is not particularly limited, and the following method can be used depending on the material: a sputtering method, an SOG method, a spin coating method, a dipping method, a spray coating method, a droplet discharge method (such as an ink-jet method), a printing method (such as screen printing or offset printing), or the like. Further, the insulating films 4021 and 506 can be formed with a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, indium tin oxide to which silicon oxide is added, or graphene.

Alternatively, the first electrode layers 4030 and 541 and the second electrode layers 4031 and 543 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

In this embodiment, since the light-emitting device illustrated in FIGS. 10A and 10B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; in the case of using a light-transmitting conductive film as the second electrode layer 543, a conductive film having a light-reflecting property is preferably stacked therewith.

A conductive composition containing a conductive high molecule (also referred to as a conductive polymer) can be used for the first electrode layers 4030 and 541 and the second electrode layers 4031 and 543. As the conductive high molecule, what is called π-electron conjugated conductive polymer can be used. Examples thereof include polyaniline or a derivative thereof, polypyrrole or a derivative thereof, polythiophene or a derivative thereof, a copolymer of two or more kinds of aniline, pyrrole, and thiophene or a derivative thereof.

Since the transistor is easily broken owing to static electricity or the like, a protective circuit for protecting the driver circuit is preferably provided. The protection circuit is preferably formed using a nonlinear element.

By using any of the transistors described in Embodiment 1 or 2 as described above, the semiconductor device can have a variety of functions.

The structures, methods, and the like described in this embodiment can be combined as appropriate with any of the structures, methods, and the like described in the other embodiments.

Embodiment 4

A semiconductor device having an image sensor function of reading information on an object can be manufactured using the transistor described in Embodiment 1 or 2.

Figure 12A:
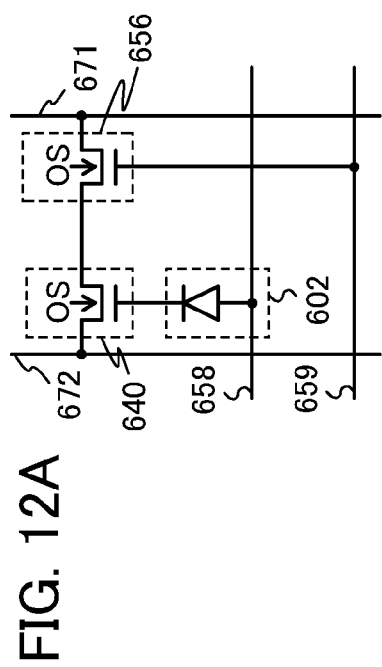
FIGS. 12A and 12B are an equivalent circuit diagram and a cross-sectional view illustrating one embodiment of a semiconductor device.

FIG. 12A illustrates an example of a semiconductor device having an image sensor function. FIG. 12A illustrates an equivalent circuit of a photo sensor, and FIG. 12B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted by a symbol "OS" so that it can be identified as a transistor including an oxide semiconductor film. In FIG. 12A, the transistor 640 and the transistor 656 are each a transistor including an oxide semiconductor film, to which any of the transistor described in Embodiments 1 or 2 can be applied. In this embodiment, an example in which a transistor having a structure similar to that of the transistor 440 described in Embodiment 1 is used is described. The transistors 640 is an inverted staggered transistor with a bottom-gate structure, in which an insulating layer functioning as a channel protective film is provided over an oxide semiconductor film.

Figure 12B:
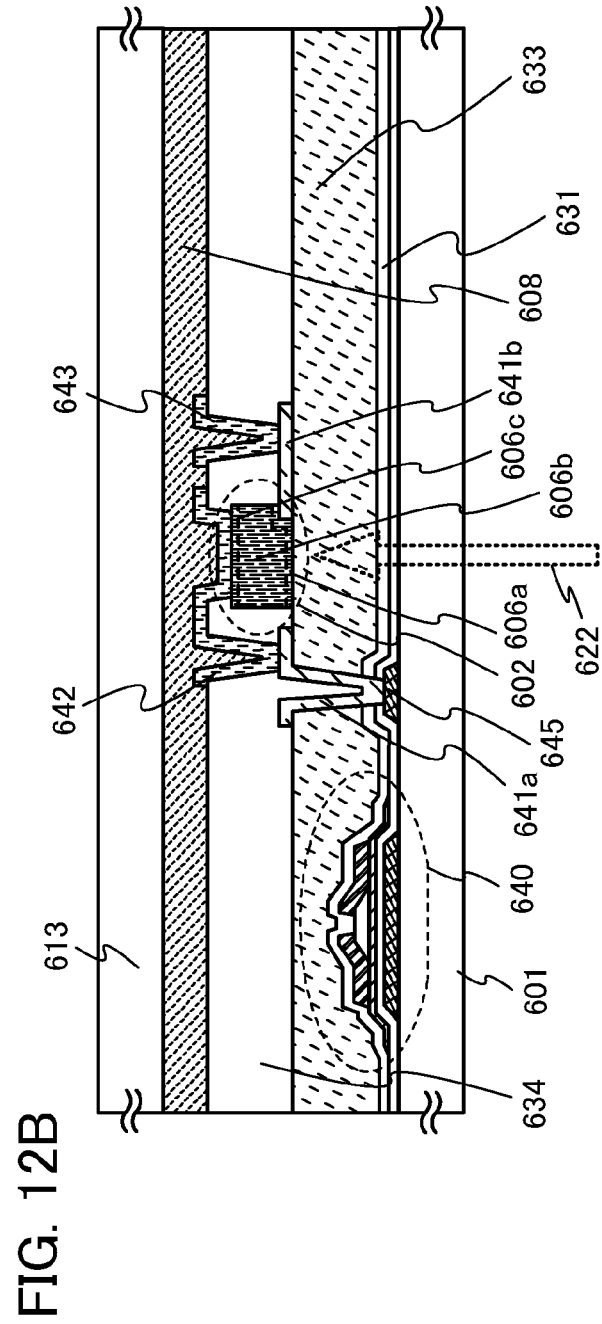

FIG. 12B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 provided therebetween.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are stacked in this order from the interlayer insulating film 633 side, between electrode layers 641a and 641b provided over the interlayer insulating film 633 and an electrode layer 642 provided over the interlayer insulating film 634.

The electrode layer 641b is electrically connected to a conductive layer 643 formed in the interlayer insulating film 634, and the electrode layer 642 is electrically connected to a conductive layer 645 through an electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with the use of a semiconductor source gas containing an impurity element belonging to Group 15 (e.g., phosphorus (P)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that the n-type semiconductor film side may alternatively be a light-receiving plane.

The insulating film 631, the interlayer insulating film 633, and the interlayer insulating film 634 can be formed using an insulating material by a sputtering method, a plasma CVD method, an SOG method, spin coating, dipping, spray coating, a droplet discharge method (such as an inkjet method), a printing method (such as screen printing or offset printing), or the like depending on the material.

The insulating film 631 can be formed using an inorganic insulating material and can have a single-layer structure or a stacked structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high shielding effect (blocking effect) and thus is less likely to transmit both oxygen and an impurity such as hydrogen or moisture.

Therefore, during the manufacturing process and after the manufacture, the aluminum oxide film functions as a protective film for preventing the entry of an impurity such as hydrogen or moisture, which can cause a change, into the oxide semiconductor film and release of oxygen, which is a main component material of the oxide semiconductor, from the oxide semiconductor film.

For a reduction in surface roughness, an insulating film functioning as a planarization insulating film is preferably used as each of the interlayer insulating films 633 and 634. For the interlayer insulating films 633 and 634, for example, an organic insulating material having heat resistance such as polyimide, an acrylic resin, a benzocyclobutene resin, polyamide, or an epoxy resin can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light 622 that enters the photodiode 602, data on an object to be detected can be read. Note that a light source such as a backlight can be used at the time of reading information on an object.

The transistor 640 has a structure similar to that of the transistor 440 described in Embodiment 1, and is obtained by a manufacturing method similar to that of the transistor 440. In the manufacturing method, a source electrode layer and a drain electrode layer are formed through an etching step using halogen plasma, and then a step in which impurities contained in the etching gas are removed from a surface of the oxide semiconductor film and the periphery thereof is performed. The impurity-removing treatment may be performed after an insulating layer functioning as a channel protective film is formed through an etching step using halogen plasma. For the impurity removal step, for example, dilute hydrofluoric acid treatment or plasma treatment using oxygen or dinitrogen monoxide can be favorably employed.

Since the surface of the oxide semiconductor film and the periphery thereof can be prevented from being contaminated by impurities contained in the etching gas, the halogen element concentration can be lower than or equal to $5\times10^{18}$ atoms/cm$^3$ (preferably lower than or equal to $1\times10^{18}$ atoms/cm$^3$) in the surface of the oxide semiconductor film of the transistor 640.

Accordingly, a highly reliable semiconductor device including the transistor 640 of this embodiment, which is formed using an oxide semiconductor film and has stable electric characteristics, can be provided. Further, a highly reliable semiconductor device can be manufactured with a high yield, which leads to high productivity.

The structures, methods, and the like described in this embodiment can be combined as appropriate with any of the structures, methods, and the like described in the other embodiments.

Embodiment 5

A semiconductor device disclosed in this specification can be applied to a variety of electronic appliances (including game machines). Examples of the electronic appliances include a television set (also referred to as a television or a television receiver), a monitor of a computer, cameras such as a digital camera and a digital video camera, a digital photo frame, a mobile phone, a portable game machine, a personal digital assistant, an audio reproducing device, a game machine (e.g., a pachinko machine or a slot machine), a game console, and the like. Specific examples of these electronic appliances are illustrated in FIGS. 13A to 13C.

Figure 13A:
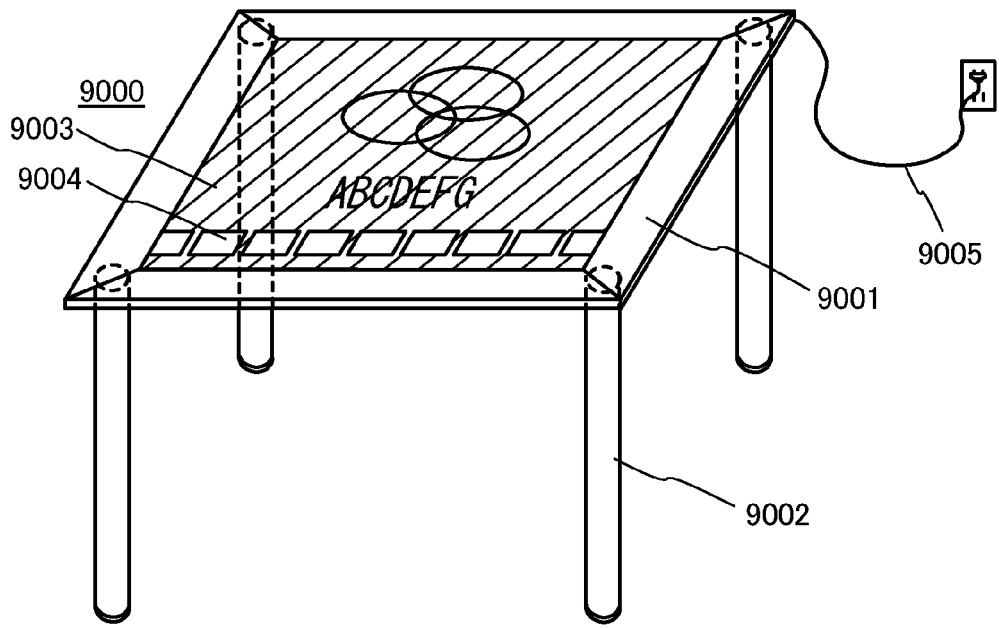
FIGS. 13A to 13C illustrate electronic appliances.
Figure 13B:
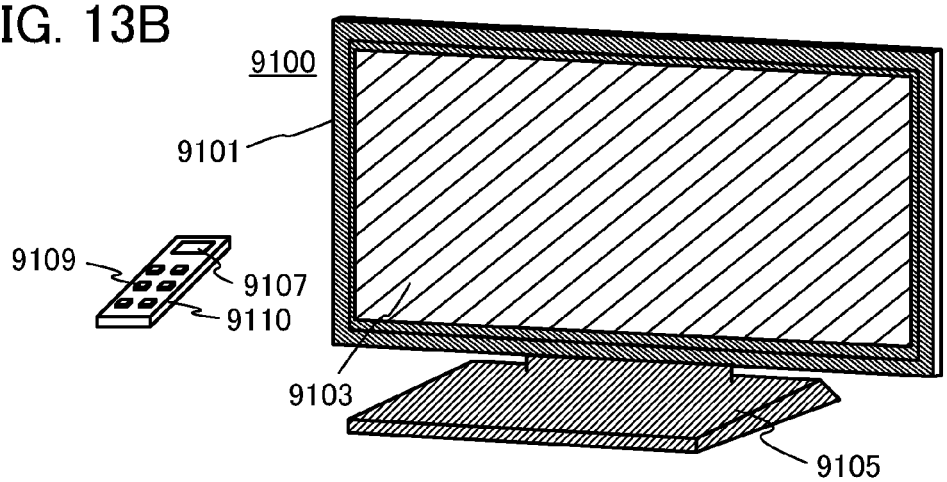
Figure 13C:
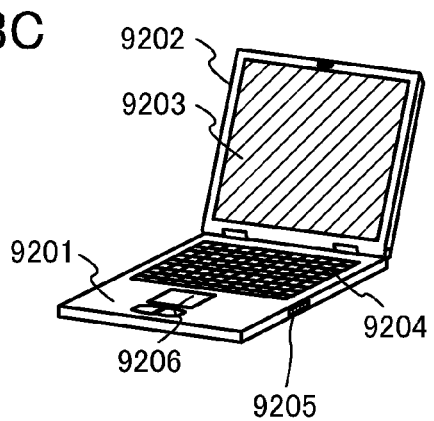

FIG. 13A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 4 can be used for the display portion 9003 so that the electronic appliances can have a high reliability.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of the semiconductor device having an image sensor function described in Embodiment 4, the display portion 9003 can have a touch-input function.

Further, the screen of the display portion 9003 can be placed perpendicular to a floor with a hinge provided for the housing 9001; thus, the table 9000 can also be used as a television device. A television set with a large screen takes up too much space that is available in a small room. However, with a table having a display portion therein, it is possible to make the use of the space in the room.

FIG. 13B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 13B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of Embodiments 1 to 4 can be used for the display portions 9103 and 9107 so that the television set and the remote controller can have high reliability.

FIG. 13C illustrates a computer which includes a main body 9201, a housing 9202, a display portion 9203, a keyboard 9204, an external connection port 9205, a pointing device 9206, and the like.

The semiconductor device described in any of Embodiments 1 to 4 can be used for the display portion 9203 so that the computer can have high reliability.

Figure 14A:
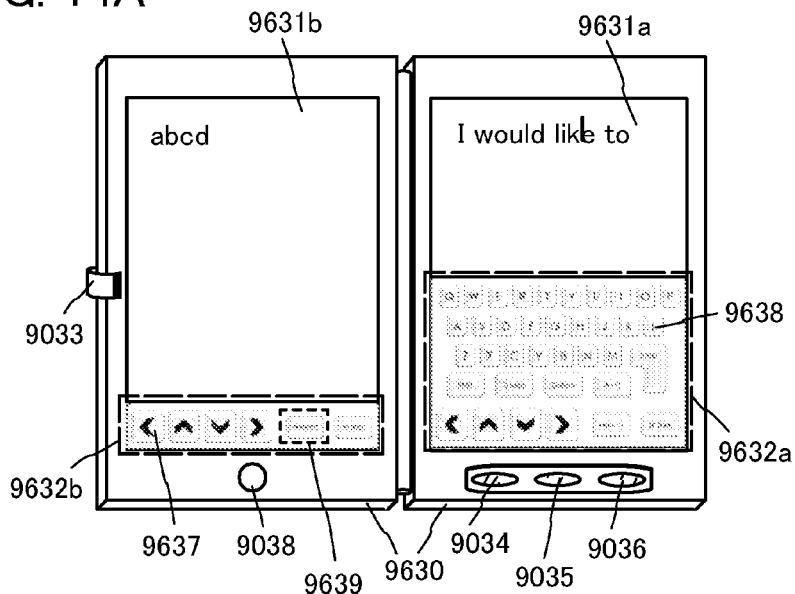
FIGS. 14A to 14C illustrate an electronic appliance.
Figure 14B:
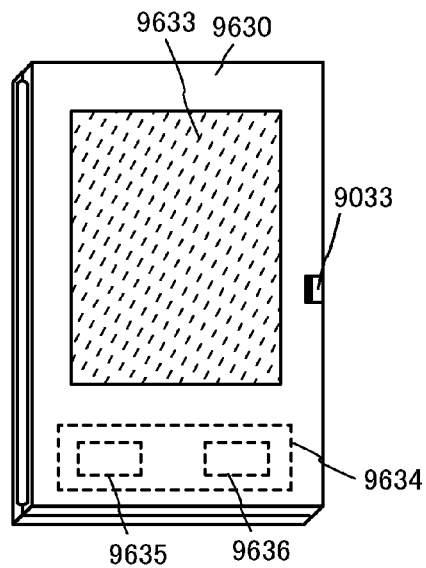

FIGS. 14A and 14B illustrate a tablet terminal that can be folded. In FIG. 14A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of Embodiments 1 to 4 can be used for the display portion 9631a and the display portion 9631b so that the tablet terminal can have high reliability.

Part of the display portion 9631a can be a touch panel region 9632a, and data can be input by touching operation keys 9638 that are displayed. Note that FIG. 14A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 can switch display orientation (e.g., between landscape mode and portrait mode) and select a display mode (switch between monochrome display and color display), for example. With the power-saving-mode switching button 9036, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 9631b have the same display area in FIG. 14A, an embodiment of the present invention is not limited to this example. The display portion 9631a and the display portion 9631b may have different areas or different display quality. For example, one of them may be a display panel that can display higher-definition images than the other.

The tablet terminal is closed in FIG. 14B. The tablet terminal includes the housing 9630, a solar battery 9633, a charge/discharge control circuit 9634, a battery 9635, and a DCDC converter 9636. Note that in FIG. 14B, a structure including a battery 9635 and a DCDC converter 9636 is illustrated as an example of the charge/discharge control circuit 9634.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 14A and 14B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

Power can be supplied to the touch panel, the display portion, an image signal processor, and the like by the solar battery 9633 attached on a surface of the tablet terminal Note that the solar battery 9633 can be provided on one or two surfaces of the housing 9630, so that the battery 9635 can be charged efficiently. When a lithium ion battery is used as the battery 9635, there is an advantage of downsizing or the like.

Figure 14C:
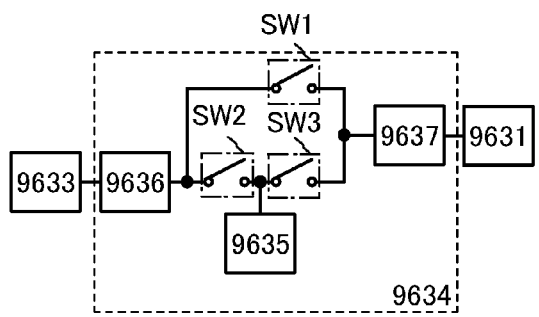

The structure and operation of the charge/discharge control circuit 9634 illustrated in FIG. 14B are described with reference to a block diagram of FIG. 14C. FIG. 14C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge/discharge control circuit 9634 in FIG. 14B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

Example 1

In this example, a metal film was formed over and in contact with an oxide semiconductor film, and then dry etching was performed to remove the metal film. The following experiment was conducted to examine the relation between resistivity and whether or not an impurity-removing treatment is performed to remove an impurity generated by the dry etching.

First, as a comparative sample, a 95-nm-thick IGZO film was formed over a glass substrate with the use of a deposition apparatus using a sputtering method, and the resistivity of the IGZO film was measured. The result was $4.8 \times 10^9$ Ω·cm. The resistivity of the IGZO film was obtained in the following manner: an electrode (a stack of a 100-nm-thick titanium film, a 400-nm-thick aluminum film, and a 100-nm-thick titanium film) having a meandering top shape was formed, and the resistance was obtained by a voltage-current two-wire measurement.

The IGZO film was formed under the following condition: an oxide target of In:Ga:Zn=1:1:1 [atomic ratio] was used, the atmosphere was an atmosphere of oxygen and argon (oxygen flow rate: 50%), the pressure was 0.6 Pa, the power of the AC power source was 5 kW, and the substrate temperature was 170° C.

A deposition apparatus using a sputtering method includes a sputtering chamber in which the pressure can be reduced by a vacuum evacuation unit such as a vacuum pump (e.g., a cryopump or a turbo molecular pump), a substrate holder on which a substrate to be processed is fixed, a target holder which holds a sputtering target, an electrode for the sputtering target held by the target holder, a power supply unit which applies AC voltage (or DC voltage) for sputtering to the electrode, and a gas supply unit which supplies a gas to the sputtering chamber. In fabrication of the sample, the sputtering chamber is kept under high vacuum so as to prevent entry of impurities as much as possible, and film formation is performed in a dry nitrogen atmosphere in which, in terms of moisture, the dew point is −40° C. or lower, preferably −50° C. or lower.

Sample 1 was obtained in such a manner that a 95-nm-thick IGZO film was formed over a glass substrate, etching was performed under a first dry etching condition for 180 seconds, and the substrate with the film was soaked in pure water. Then an electrode was formed and the resistivity was measured. The result of Sample 1 was 130 Ω·cm. Sample 2 was obtained by soaking the substrate with film in diluted hydrofluoric acid (diluted at a ratio of 1:100) for 30 seconds after the etching under the first dry etching condition. Then an electrode was formed and the resistivity was measured. The result of Sample 2 was $3.9 \times 10^9$ Ω·cm.

These results confirm the following: dry etching using a gas containing a halogen element causes an impurity to be attached to or mixed into the IGZO film, so that the resistivity thereof is lowered; however, the impurity is removed by surface treatment using dilute hydrofluoric acid, so that the IGZO film has a state close to that before the dry etching.

Sample 3 was obtained in such a manner that a 95-nm-thick IGZO film was formed over a glass substrate, etching was performed under a second dry etching condition for 180 seconds, and the substrate with the film was soaked in pure water. Then an electrode was formed and the resistivity was measured. Sample 4 was obtained by soaking the substrate with the film in diluted hydrofluoric acid (diluted at a ratio of 1:100) for 30 seconds after the etching under the second dry etching condition. Then an electrode was formed and the resistivity was measured.

Sample 5 was obtained in such a manner that a 95-nm-thick IGZO film was formed over a glass substrate, etching was performed under a third dry etching condition for 180 seconds, and the substrate with the film was soaked in pure water. Then, an electrode was formed and the resistivity was measured. Sample 6 was obtained by soaking the substrate with the film in diluted hydrofluoric acid (diluted at a ratio of 1:100) for 30 seconds after the etching under the third dry etching condition. Then an electrode was formed and the resistivity was measured.

Sample 7 was obtained in such a manner that a 95-nm-thick IGZO film was formed over a glass substrate, etching was performed under a fourth dry etching condition for 180 seconds, and the substrate with the film was soaked in pure water. Then, an electrode was formed and the resistivity was measured. Sample 8 was obtained by soaking the substrate with the film in diluted hydrofluoric acid (diluted at a ratio of 1:100) for 30 seconds after the etching under the fourth dry etching condition. Then an electrode was formed and the resistivity was measured.

Table 1 shows the first dry etching condition, the second dry etching condition, the third dry etching condition, and the fourth dry etching condition. As an apparatus for dry etching, an ICP etching apparatus was used.

TABLE 1

|  | ICP (W) | Bias (W) | Pressure (Pa) | $Cl_2$ (sccm) | $BCl_3$ (sccm) | $SF_6$ (sccm) | $O_2$ (sccm) | Time (sec) |
|---|---|---|---|---|---|---|---|---|
| First etching condition | 2000 | 200 | 2.0 | — | — | 900 | 100 | 180 |
| Second etching condition | 2000 | 1000 | 2.5 | 540 | — | 540 | — | — |
| Third etching condition | 0 | 1500 | 2.0 | 150 | 750 | — | — | — |
| Fourth etching condition | 2000 | 1000 | 2.5 | — | 380 | 700 | — | — |

Figure 16:
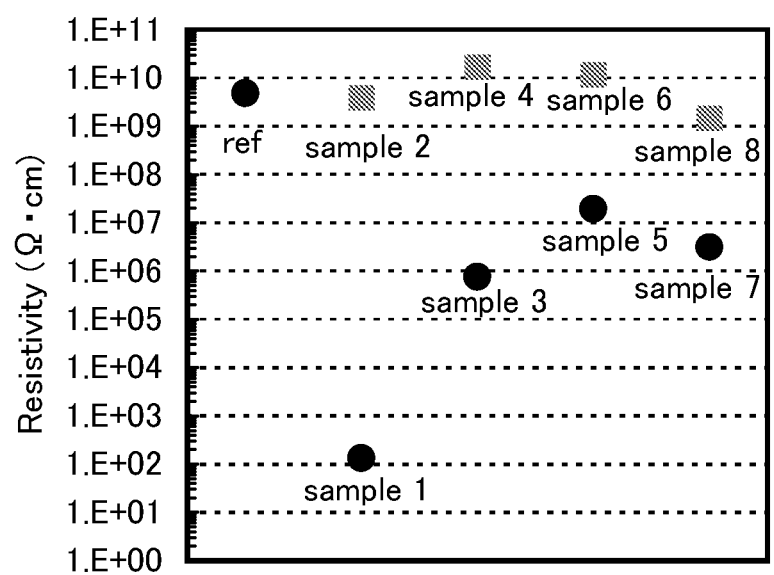
FIG. 16 is a graph showing a relation between resistivity and whether or not diluted hydrofluoric acid treatment is performed.

In a graph of FIG. 16, the vertical axis represents resistivity and the resistivity of the comparative sample and the resistivities of Samples 1 to 8 are shown. The results confirm that, regardless of dry etching condition, surface treatment using dilute hydrofluoric acid enables the IGZO film to have a state close to, preferably the same as, that before the dry etching.

This application is based on Japanese Patent Application serial no. 2011-233171 filed with Japan Patent Office on Oct. 24, 2011 and Japanese Patent Application serial no. 2011-233274 filed with Japan Patent Office on Oct. 24, 2011, the entire contents of which are hereby incorporated by reference.

What is claimed is:

1. A method for manufacturing a semiconductor device, comprising the steps of:
    forming a gate electrode layer over an insulating surface;
    forming a gate insulating film over the gate electrode layer;
    forming an oxide semiconductor film over the gate insulating film;
    forming an insulating layer over the oxide semiconductor film, the insulating layer overlapping with the gate electrode layer;
    forming a conductive film over the oxide semiconductor film and the insulating layer;
    etching the conductive film with an etching gas containing a halogen element to form a source electrode layer and a drain electrode layer; and
    removing the halogen element from the oxide semiconductor film by oxygen plasma treatment or dinitrogen monoxide plasma treatment.

2. The method for manufacturing a semiconductor device, according to claim 1, wherein a chlorine concentration in the oxide semiconductor film subjected to the removing step is lower than or equal to $5\times10^{18}$ atoms/cm$^3$.

3. A method for manufacturing a semiconductor device, comprising the steps of:
    forming a gate electrode layer over an insulating surface;
    forming a gate insulating film over the gate electrode layer;
    forming an oxide semiconductor film over the gate insulating film;
    forming an insulating layer over the oxide semiconductor film;
    etching the insulating layer with an etching gas containing a halogen element to form a channel protective film in a position overlapping with the gate electrode layer;
    removing the halogen element from the oxide semiconductor film by oxygen plasma treatment or dinitrogen monoxide plasma treatment;
    forming a conductive film over the oxide semiconductor film and the channel protective film; and
    etching the conductive film to form a source electrode layer and a drain electrode layer.

4. The method for manufacturing a semiconductor device, according to claim 3, wherein a chlorine concentration in the oxide semiconductor film subjected to the removing step is lower than or equal to $5\times10^{18}$ atoms/cm$^3$.

5. A method for manufacturing a semiconductor device, comprising the steps of:
    forming a gate electrode layer over an insulating surface;
    forming a gate insulating film over the gate electrode layer;
    forming an oxide semiconductor film over the gate insulating film;
    forming an insulating layer over the oxide semiconductor film;
    etching the insulating layer with a first etching gas containing a halogen element to form a channel protective film in a position overlapping with the gate electrode layer;
    removing the halogen element contained in the first etching gas from the oxide semiconductor film;
    forming a conductive film over the oxide semiconductor film and the channel protective film;
    etching the conductive film with a second etching gas containing a halogen element to form a source electrode layer and a drain electrode layer; and
    removing the halogen element contained in the second etching gas from the oxide semiconductor film.

6. The method for manufacturing a semiconductor device, according to claim 5, wherein a chlorine concentration in the oxide semiconductor film subjected to the removing step with the second etching gas is lower than or equal to $5\times10^{18}$ atoms/cm$^3$.

7. The method for manufacturing a semiconductor device, according to claim 5, wherein oxygen plasma treatment or dinitrogen monoxide plasma treatment is performed as at least one of the removing step with the first etching gas and the removing step with the second etching gas.

8. The method for manufacturing a semiconductor device, according to claim 5, wherein cleaning treatment with a diluted hydrofluoric acid solution is performed as at least one of the removing step with the first etching gas and the removing step with the second etching gas.

* * * * *

UNITED STATES PATENT AND TRADEMARK OFFICE
CERTIFICATE OF CORRECTION

| | |
|---|---|
| PATENT NO. | : 8,815,640 B2 |
| APPLICATION NO. | : 13/652668 |
| DATED | : August 26, 2014 |
| INVENTOR(S) | : Katsuaki Tochibayashi et al. |

It is certified that error appears in the above-identified patent and that said Letters Patent is hereby corrected as shown below:

In the Specification

Column 29, line 15, "OV," should be --0V,--.

Signed and Sealed this
Seventeenth Day of February, 2015

Michelle K. Lee
*Deputy Director of the United States Patent and Trademark Office*